(12) United States Patent
Cideciyan et al.

(10) Patent No.: US 6,643,814 B1
(45) Date of Patent: Nov. 4, 2003

(54) MAXIMUM TRANSITION RUN ENCODING AND DECODING SYSTEMS

(75) Inventors: Roy D. Cideciyan, Rueschlikon (CH); Jonathan D. Coker, Rochester, MN (US); Evangelos S. Eleftheriou, Zurich (CH); Richard L. Galbraith, Rochester, MN (US); Dave James Stanek, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 590 days.

(21) Appl. No.: 09/583,193

(22) Filed: May 30, 2000

(30) Foreign Application Priority Data

Jul. 12, 1999 (EP) ............................ 99113399
Apr. 4, 2000 (EP) ............................ 00810294

(51) Int. Cl.[7] ............................................. H03M 13/00
(52) U.S. Cl. ...................................... 714/755; 714/758
(58) Field of Search ......................... 341/59, 58, 95; 714/801, 752, 755, 758

(56) References Cited

U.S. PATENT DOCUMENTS

| | | | | |
|---|---|---|---|---|
| 5,859,601 A | * | 1/1999 | Moon et al. ................. | 341/59 |
| 6,018,304 A | * | 1/2000 | Bessios ....................... | 341/58 |
| 6,052,072 A | * | 4/2000 | Tsang et al. ................. | 341/59 |
| 6,127,954 A | * | 10/2000 | Kim ............................. | 341/95 |
| 6,241,778 B1 | * | 6/2001 | de Lind van Wijngaarden et al. .. | 341/58 |
| 6,282,690 B1 | * | 8/2001 | McClellan et al. ........... | 714/801 |
| 6,388,587 B1 | * | 5/2002 | Brickner et al. ............. | 341/59 |

* cited by examiner

Primary Examiner—David Ton
(74) Attorney, Agent, or Firm—Daniel E. McConnell

(57) ABSTRACT

Maximum transition run encoding of a succession of M-bit data words to produce a succession of N-bit code words, where N→-M, for supply to a magnetic recording channel is described. Each M-bit data word is encoded in accordance with an MTR coding scheme to produce a G-bit word, where N→-G→M, such that the maximum number of consecutive bits of a first value, generally bits of value "1", in a succession of the G-bit words is limited to a first predetermined value $j_1$. The G-bit word is then encoded to produce an N-bit word in accordance with a second coding scheme.

49 Claims, 11 Drawing Sheets

MAXIMUM TRANSITION RUN ENCODING AND DECODING SYSTEMS

FIELD OF THE INVENTION

This invention relates generally to methods and apparatus for implementing Maximum Transition Run (MTR) coding schemes, and to corresponding decoding systems.

BACKGROUND TO THE INVENTION

Channel codes, whereby input data bits are mapped to channel bits by a coding process, are commonly used to improve the characteristics of the bit-stream supplied to a recording channel. The code rate for such a code is usually specified as M/N and indicates the ratio of the number of data bits M to channel bits N. MTR codes are a particular type of channel code used to improve the characteristics of data to be supplied to a magnetic recording channel wherein the data is recorded on a magnetic recording medium such as a magnetic disk or tape. With air MTR codes the number of consecutive transitions that can occur in the magnetization pattern on the recording medium is limited to a particular number denoted by "j". Thus, when used in conjunction with the NRZI (Non-Return-to-Zero-Inversion) recording format where "1" represents a magnetic transition and "0" no transition, an MTR code limits the maximum number of consecutive 1's at the NRZI encoder input. This j constraint has the desirable consequence of reducing errors in data recovery. More particularly, the bit-error rate performance is improved by providing a distance gain, i.e. an increase in the minimum Euclidean distance between recording patterns, or by eliminating likely error events, thus reducing the likelihood of errors in sequence detectors on the data recovery side. For example, when used in conjunction with higher-order partial response shaping and maximum likelihood sequence detection such as in an E2PR4 partial response channel, MTR codes with j=2 can deliver a distance gain of 2.2 dB. MTR codes with j=2 are also write-friendly, allowing user data to be written to a disk at very high data rates. High code-rate MTR codes are therefore of great interest, and particularly so for the higher-order partial response channels used in disk drives for example. Particular examples of MTR codes and encoding/decoding systems are disclosed in European patent application no. 99113399.2, assigned to the Assignee of the present application, and the prior art discussed in the introduction thereof.

Run Length Limited (RLL) codes are another type of channel code commonly used in magnetic recording. These codes impose a (G, I) constraint on the recorded data sequence, where "G" denotes the maximum number of consecutive 0's in the bit stream and "1" denotes the maximum number of consecutive 0's in the odd and even interleaved bit streams. IEEE Transactions on Magnetics, vol. 34, pp. 2382–2386, July 1998, "A New Target Response with Parity Coding for High Density Magnetic Recording Channels", proposes a parity-based coding scheme in which a single parity bit is appended to RLL encoded data to allow detection of the dominant error events for a particular detector target. The proposed detection system is based on a Viterbi detector matched to the channel response which outputs estimates of the recorded code words, and a post-processor which correlates noise estimates with the dominant error events to indicate the type and position of the most-likely error event where the parity constraint is violated by an estimated code word.

As discussed further below, particular decoder systems embodying the present invention employ Noise Predictive Maximum Likelihood (NPML) detectors in conjunction with parity-based post processors. NPML, or "fractional target", detection with finite impulse response (FIR) or infinite impulse response (IIR) targets is disclosed in International patent applications no's. WO 97/11544 and WO 98/52330 respectively, both assigned to the Assignee of the present application. Further, noise predictive post-processor designs for RLL encoded data are disclosed in the following: U.S. Pat. No. 5,949,831; International patent application no. PCT/US99/19910; and U.S. patent application Ser. No. 09/517,352, all assigned to the Assignee of the present application. In these cases, the post-processing schemes utilize IIR prediction/whitening filters and the error event detection mechanism is threshold based. Also as discussed below, particular encoder systems embodying the invention utilize a partial response precoder which operates on parity-coded data. U.S. Pat. No. 5,809,081 discloses systems in which an encoder adds one or two bits to an input word to generate a code string for supply to a precoder such that the precoded string has a preselected parity structure. U.S. Pat. No. 5,809,080 discloses a noise predictive Viterbi detector for such a system, the detector using a combined encoder parity and partial response trellis.

SUMMARY OF THE INVENTION

According to a first aspect of the present invention there is provided a method for encoding a succession of M-bit data words to produce a succession of N-bit code words, where N>M, for supply to a magnetic recording channel, the method comprising the steps of:

encoding each M-bit data word in accordance with an MTR coding scheme to produce a G-bit word, where N>G>M, such that the maximum number of consecutive bits of a first value in a succession of said G-bit words is limited to a first predetermined value $j_1$; and encoding said G-bit word to produce a said N-bit word in accordance with a second coding scheme wherein at least one parity bit, dependent on the bit-values of said G-bit word, is generated, such that the N-bit word satisfies a predetermined parity condition, and wherein bits of said first value in the G-bit word are mapped to respective bits of the N-bit word which are each of different value to the immediately preceding bit in the N-bit word;

wherein the second coding scheme is such that, in a succession of said N-bit words, the maximum number of consecutive bits which are each of different value to the immediately preceding bit is limited to a second predetermined value $j_2$.

In methods embodying the present invention, therefore, M-bit data words are first encoded according to an MTR encoding scheme to produce G-bit words satisfying an MTR $j=j_1$ constraint. Thus, in a succession of these G-bit words, the maximum number of consecutive bits of a first value (which value corresponds to a transition in the eventual channel magnetization pattern) is limited to $j_1$. (As will be appreciated, in embodiments conforming to the convention for MTR codes, the said bits of a first value will be bits of value "1"). Each G-bit word is then encoded to produce an N-bit word in accordance with a second coding scheme wherein one or more parity bits is generated, and bits of said first value in the G-bit word are mapped to respective bits of the N-bit word which are each of a different value to the immediately preceding bit of the N-bit word. Thus, bits of said first value are effectively mapped to bit-value transitions in the N-bit words, and hence to transitions in the magnetization pattern corresponding to the N-bit code words which is obtained on recording. The second coding scheme is implemented such that the maximum number of consecutive bit-value transitions in the output N-bit code words is limited to a predetermined value $j_2$. The second coding scheme therefore results in a succession of N-bit words which satisfy an MTR $j=j_2$ constraint as well as a predetermined parity condition. Thus, in contrast to mere appending of a single parity bit to an RLL code as in the prior proposal referenced above, in embodiments of the present invention an MTR coding scheme is employed in the first encoding stage, and the second encoding stage, which involves the parity coding, is performed in such a manner that the resulting N-bit word still satisfies an MTR j constraint. As will be demonstrated by the particular examples described below, such encoding methods allow substantial performance gains to be achieved over both conventional MTR codes and RLL codes combined with a single parity bit. Moreover, while in general one or more parity bits may be employed, preferred embodiments utilize a plurality of parity bits. This provides for significantly improved operation by reducing the likelihood of errors on the data recovery side, while still preserving the MTR j constraint in the output code words on the recording side. Thus, the parity condition imposed on the output code words may be defined by one or more equations depending on the particular number of parity bits employed.

While the parity coding and the mapping of bits to bit-value transitions in the output code words could be combined in a single coding step, to simplify the encoding process it is preferred that the mapping of bits to bit-value transitions is performed as a separate step to the parity coding. In particular, the mapping process is most conveniently implemented by a partial response preceding step, specifically a $1/(1 \oplus D)$ coding step. Further, while the $1/(1 \oplus D)$ coding step could be performed before the parity coding step, the encoding process is simplified in preferred embodiments by performing the parity coding step before the $1/(1 \oplus D)$ coding step. Either way, it will be appreciated that, as a result of the parity coding (and any further coding steps as discussed below), not all of the bits of said first value in a G-bit word may map directly to bit-value transitions in the resulting N-bit code word, and references to this mapping process herein should be construed accordingly.

In some embodiments, the second encoding scheme may consist simply of a parity coding step, whereby the one or more parity bit(s) are generated and inserted in the G-bit word, followed by a $1/(1 \oplus D)$ coding step whereby the resulting parity-coded word is subjected to $1/(1 \oplus D)$ coding to produce the required N-bit code word. In other embodiments, the second encoding scheme may include one or more further encoding steps, and the order of the various steps can be varied in these embodiments. In general therefore, the parity bits generated in accordance with the second encoding scheme may be dependent directly or indirectly on the bit-values of the initial G-bit word, and may be inserted in the G-bit word itself or a word resulting from further encoding the G-bit word before the parity coding is performed, depending on the number and order of steps in the process of encoding a G-bit word into an N-bit word. The important point is that an MTR j constraint is preserved in the output N-bit words. The way in which this is achieved will in general depend on the particular MTR coding scheme employed in the first encoding stage. For example, the (or each) parity bit may be inserted between a predetermined pair of bits in the G-bit word, the parity bit locations being selected such that the resulting code word satisfies the required MTR constraint. In other embodiments, additional encoding steps may be employed as already mentioned. In preferred embodiments, the second encoding scheme is designed such that $j_2=j_1$. However, even with careful selection of the parity-bit location(s), the parity coding will usually result in a less stringent j constraint in the parity-coded word. Accordingly, in particularly preferred embodiments the parity-coded word is further encoded in accordance with a further coding scheme, such as an appropriately designed block code, to improve the MTR j constraint in the resulting N-bit words. For example, in a particular embodiment discussed below where the parity coding alone would result in $j_2>j_1$, such a block code is employed to restore $j_2$ to $j_1$. In another embodiment discussed below where the initial MTR coding scheme results in a time-varying $j=3/4$ constraint, the second encoding scheme is efficiently designed such that the parity coding alone would result in $j_2=j_1=4$ (or more precisely 3/4), but with runs of four consecutive transitions occurring more frequently in the output code words. Here, a block code is employed to improve the output MTR j constraint by reducing the frequency of occurrence of four consecutive transitions. In general therefore, the purpose of the block code (or other further coding scheme) in preferred embodiments is to eliminate at least some occurrences of the maximum number of consecutive bit value transitions in the set of possible N-bit code words, the block code being designed such that $j_2=j_1$. As in the examples below, in particularly preferred embodiments the block code employed as the further coding scheme is a rate X/X block code, where $X \leq N$, to avoid reduction of the overall code rate as far as possible.

The MTR coding scheme used in the initial step of encoding an M-bit word into a G-bit word may take various forms depending on the particular MTR code (or codes) used. For example, in some embodiments a basic rate M/G MTR code may be applied so that the MTR coding scheme consists simply of a single application of the rate M/G MTR code. In other embodiments, for example, a basic MTR code may be applied to portions of the input M-bit word, sequentially or in parallel, so that the resulting MTR-coded portions collectively constitute the G-bit word. In particular, in preferred embodiments the step of encoding each M-bit data word comprises partitioning the M-bit data word into a plurality of m-bit blocks and encoding each m-bit block in accordance with a rate m/g MTR code to produce a g-bit block, whereby the resulting plurality of g-bit blocks produced from the M-bit data word collectively constitute the G-bit word.

Particular examples of encoding methods which employ the above ideas to achieve highly efficient, high code-rate systems will be described in detail below. However, those skilled in the art will be able to design other examples based on the techniques described herein.

A second aspect of the present invention provides a method for processing data reproduced from a magnetic recording medium, wherein the reproduced data corresponds to a succession of N-bit code words, produced from a succession of M-bit data words by an encoding method according to the first aspect of the invention, recorded on the recording medium. The processing method comprises the steps of:

processing the reproduced data in dependence on said predetermined parity condition to detect the N-bit code words corresponding thereto;

decoding each N-bit code word in accordance with a decoding scheme which is the inverse of said second encoding scheme to produce the corresponding said G-bit word; and decoding each G-bit word in accordance with an MTR decoding scheme which is the inverse of said MTR encoding scheme to recover the corresponding said M-bit data word.

It is to be appreciated that, in general, where features are described herein with reference to a method embodying the invention, corresponding features may be provided in accordance with apparatus embodying the invention, and vice versa. For example, a third aspect of the present invention provides apparatus for encoding a succession of M-bit data words to produce a succession of N-bit code words, where N>M, for supply to a magnetic recording channel, the apparatus comprising:

a first encoder for encoding each M-bit data word in accordance with an MTR coding scheme to produce a G-bit word, where N>G>M, such that the maximum number of consecutive bits of a first value in a succession of said G-bit words is limited to a first predetermined value $j_1$; and a second encoder for encoding said G-bit word to produce a said N-bit word in accordance with a second coding scheme whereby the second encoder generates at least one parity bit, dependent on the bit-values of said G-bit word, such that the N-bit word satisfies a predetermined parity condition, and maps bits of said first value in the G-bit word to respective bits of the N-bit word which are each of different value to the immediately preceding bit in the N-bit word;

wherein the second coding scheme is such that, in a succession of said N-bit words, the maximum number of consecutive bits which are each of different value to the immediately preceding bit is limited to a second predetermined value $j_2$.

A fourth aspect of the invention provides apparatus for processing data reproduced from a magnetic recording medium, wherein the reproduced data corresponds to a succession of N-bit code words, produced from a succession of M-bit data words by encoding apparatus according to the third aspect of the invention, recorded on said recording medium. The processing apparatus comprises:

a detector for processing the reproduced data in dependence on said predetermined parity condition to detect the N-bit code words corresponding thereto;

a first decoder for decoding each N-bit code word in accordance with a decoding scheme which is the inverse of said second encoding scheme to produce the corresponding said G-bit word; and a second decoder for decoding each G-bit word in accordance with an MTR decoding scheme which is the inverse of said MTR encoding scheme to recover the corresponding said M-bit data word.

A further aspect of the invention provides a data storage system comprising: encoder apparatus according to the third aspect of the invention; a recording channel comprising means for recording a succession of the N-bit code words on a magnetic recording medium, and means for reading the magnetic recording medium to generate reproduced data corresponding to said N-bit code words; and processing apparatus according to the fourth aspect of the invention.

BRIEF DESCRIPTION OF THE DRAWINGS

Preferred embodiments of the invention will now be described, by way of illustrative and non-limiting example, with reference to the accompanying drawings in which.

DESCRIPTION OF PREFERRED EMBODIMENTS

Before describing MTR/parity encoding systems embodying the invention, two basic MTR codes which are used as "mother codes" in the MTR/parity encoding systems, and the construction and operation of MTR encoders and decoders for these basic codes, will first be described with reference to FIGS. 1 to 6. The basic codes are a rate 16/19 MTR j=2 code, and a rate 16/17 j=3/4 code. These codes and the corresponding encoders/decoders are also disclosed in European patent application no. 99113399.2 referenced above.

Figures 1, 2:
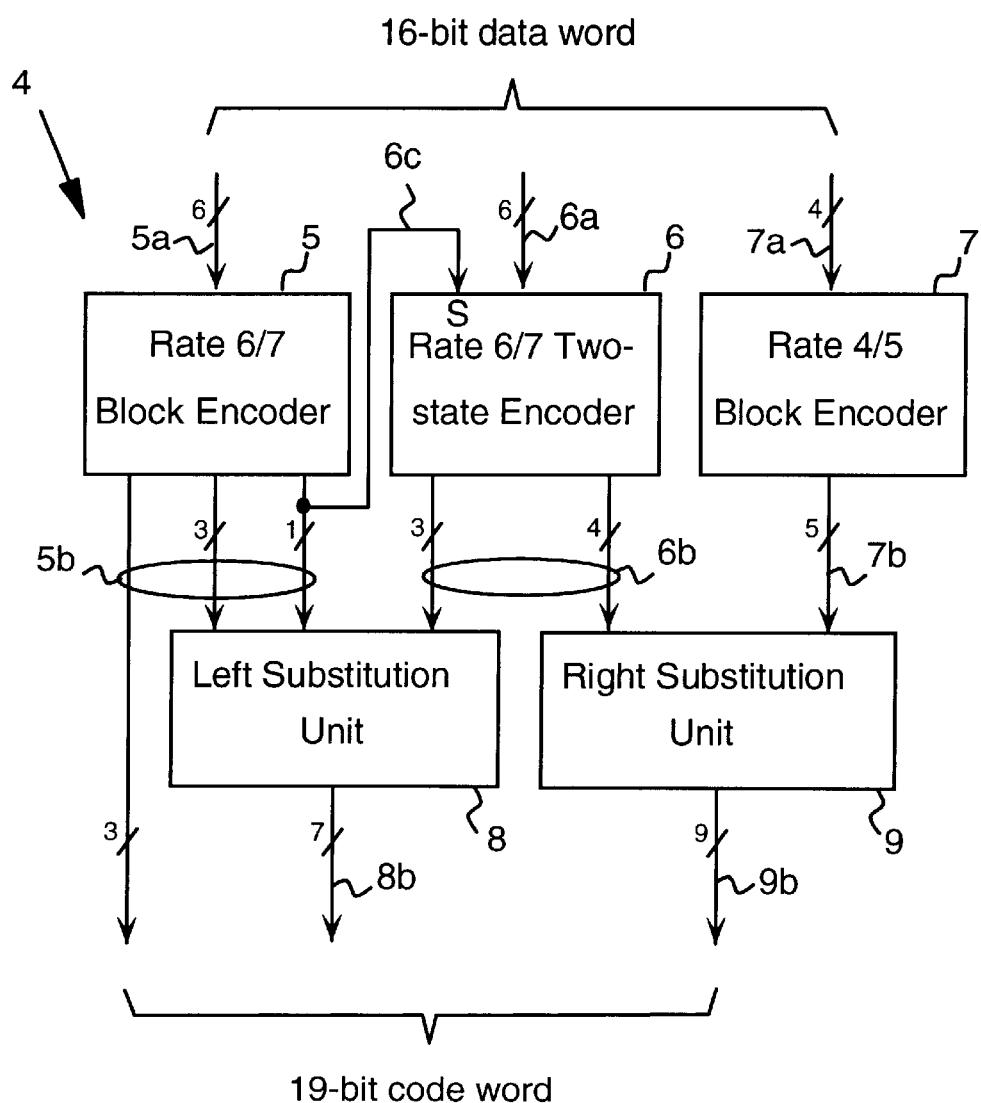
FIG. 1 shows a finite state transition diagram for the MTR j=2 constraint.
FIG. 2 is a block diagram of a rate 16/19 MTR encoder used in embodiments of the invention.

FIG. 1 shows a three-state right-resolving finite state transition diagram (FSTD) that generates all bit sequences satisfying the MTR j=2 constraint. This FSTD is unique for j=2 in that it has the least number of states of all possible right resolving representations. Such an FSTD is known in the art as a "Shannon cover". FIG. 1 thus shows the Shannon cover for j=2. Bit sequences can be generated from the Shannon cover by starting in any of the labeled states 1, 2 or 3 and successively moving along the arrows, where the arrows shown in solid lines signify a bit of value "0", and the arrows shown in broken lines signify a bit of value "1". Examination of this diagram shows that all bit sequences that can be generated have a maximum of j=2 consecutive 1's. Reference will be made to this diagram in describing the basic rate 16/19 MTR code.

FIG. 2 is a schematic block diagram of an MTR encoder 4 for implementing the rate 16/19 MTR code. More specifically, the encoder 4 implements a rate 16/19 MTR code with j=2, but with two additional constraints: k=9 and q=14. Here, "k" denotes the maximum number of consecutive bits of value "0" in the output encoded bit-stream. "q" denotes the maximum number of bits in any sequence repeating the bit series "1100" in the output encoded bit-stream. (These bit sequences are undesirable in general since they do not accumulate Euclidean distance in the sequence detector, so the coded bit-sequence is more liable to be identified incorrectly). Thus, the code implemented by the MTR encoder 4 will be referred to herein in the format MTR(j, k/q) as an MTR(2, 9/14) code. As illustrated in FIG. 2, the MTR encoder 4 comprises three input encoders 5, 6 and 7 each of which implements a finite-state coding scheme. The encoder 5 is a rate 6/7 block encoder having a 6-bit data input 5a and a 7-bit output indicated generally at 5b. The encoder 6 is a rate 6/7 two-state encoder having a 6-bit data input 6a and a 7-bit output indicated generally at 6b. The last bit-line of the output 5b of encoder 5 is connected to a 1-bit input 6c of the two-state encoder 6 to set the state S thereof as explained below. The encoder 7 is a rate 4/5 block encoder having a 4-bit data input 7a and a 5-bit output 7b. The MTR encoder 4 further includes violation correction means in the form of a left substitution unit 8 and a right substitution unit 9. The right-hand four bit-lines of the encoder output 5b, and the left-hand three bit-lines of the encoder output 6b form the input of the left substitution unit 8 as shown. The right-hand four bit-lines of the encoder output 6b and the five bit-lines of the encoder output 7b form the input to the right substitution unit 9. Together with the left-hand three bit lines of the encoder output 5b, a 7-bit output 8b of the unit 8 and 9-bit output 9b of the unit 9 form the 19-bit output of the MTR encoder 4.

In operation of the MTR encoder 4, 16-bit data words are supplied successively to the MTR encoder 4 for coding. Specifically, the 16 bits of each data word are supplied to the 16 bit-lines of the encoder inputs 5a, 6a and 7a which therefore serve to partition the input word into three blocks of six, six and four bits respectively. The encoders 5 to 7 encode the input blocks in accordance with respective coding schemes to be described in detail below. The input blocks are thereby coded to produce first, second and third subcode words on the outputs 5b, 6b and 7b respectively, whereby the original 16-bit data word has been converted into a 19-bit sequence. The left and right substitution units 8 and 9 operate to check for violations of the coding constraints by detecting prohibited bit patterns in the bit sequences supplied to their inputs and replacing any such prohibited patterns by substitute bit patterns as described in more detail below. After this violation correction stage the 19-bit code word for the input data word appears on the 19 bit-lines forming the output of the MTR encoder.

The rate 6/7 block code implemented by the encoder 5 is constructed as follows. Referring to the FIG. 1, fifty-seven potential 7-bit subcode words can be generated by starting from state two in the Shannon cover and making seven transitions such that the sequence ends in states 1 or 2. The fifty-seven words in this set can be freely concatenated to obtain sequences satisfying the j=2 constraint. This set of words is then augmented by eleven 7-bit words that are generated by starting in state 2 in FIG. 1 and ending in state 3. The first two bits of the eleven words are either 00, 01 or 10, and the last three bits are always 011. In hexadecimal format these eleven words are 03, 0B, 13, 23, 43, 1B, 2B, 4B, 33, 53 and 5B. This gives a total of sixty-eight potential subcode words, i.e. four more than are required to construct a rate 6/7 code. The words 00, 01, 4C and 33 are discarded to obtain the final set of sixty-four subcode words. Thus, in the encoder 5, each 6-bit input block is mapped to a 7-bit subcode word. The particular mapping of input blocks to subcode words as defined in the encoder is a matter of design choice and is not critical to operation of the system.

The encoder 6 implements a rate 6/7 two-state code where the last bit of the first subcode word from the encoder 5 determines the current state S of the encoder 6. This code is constructed as follows. There are sixty-two state-independent subcode words obtained from the same initial list of sixty-eight words discussed above by discarding the six words 00, 4C, 33, 19, 56 and 06. The sixty-two 6-bit input blocks assigned to these 62 state-independent subcode words are preferably selected such that the logic implementation of the encoder is as simple as possible. Again, the particular one-to-one mapping of data blocks to subcode words is a matter of design choice. One out of the two remaining input blocks is mapped to the subcode word 56 if S=0 or to the subcode word 33 if S=1. The last remaining input block is mapped to the subcode word 4C if S=0 or to the subcode word 06 if S=1.

The rate 4/5 block code implemented by the encoder 7 is constructed as follows. A total of seventeen potential subcode words can be generated by starting from state 2 in the Shannon cover of FIG. 1 and making five transitions ending in state 1 or state 2. These are 00, 01, 02, 04, 05, 06, 08, 09, 0A, 0C, 0D, 10, 11, 12, 14, 15 and 16. Of these 00 is discarded to obtain the sixteen subcode words needed for the rate 4/5 code. (This rate 4/5 block code is also disclosed in EEE Transactions on Magnetics, vol. 33, no. 5, September 1997, "Design of a Rate 6/7 Maximum Transition Run Code", Brickner and Moon).

None of the subcode words for the first rate 6/7 code can start with 11 and none of the subcode words for the rate 4/5 code can end in 11. Thus, violation of the j=2 constraint across the boundaries of 19-bit code words is not possible. However, violations could occur at the boundary between the two 7-bit subcode words output by the encoders 5 and 6, or at the boundary between the 7-bit output of the encoder 6 and the 5-bit output of the encoder 7. This is dealt with in the violation correction stage implemented by the substitution units 8 and 9 as follows.

The prohibited bit patterns, and the substitute patterns with which they are replaced in the left substitution unit 8 are defined in Table 1 below, where the 19-bit sequence output by the encoders 5 to 7 is represented by $y^1, y^2, y^3, \ldots, y^{18}, y^{19}$.

TABLE 1

| Prohibited Pattern | | | | | | | Substitute Pattern | | | | | |
|---|---|---|---|---|---|---|---|---|---|---|---|---|
| $y^4$ | $y^5$ | $y^6$ | $y^7$ | $y^8$ | $y^9$ | $y^{10}$ | $y^4$ | $y^5$ | $y^6$ | $y^7$ | $y^8$ | $y^9$ | $y^{10}$ |
| $y^4$ | 0 | 1 | 1 | 1 | 0 | 0 | $y^4$ | 0 | 1 | 0 | 1 | 1 | 0 |
| 0 | 0 | 1 | 1 | 1 | 0 | 1 | 0 | 1 | 0 | 0 | 1 | 1 | 0 |
| 1 | 0 | 1 | 1 | 1 | 0 | 1 | 0 | 1 | 1 | 0 | 1 | 1 | 0 |
| $y^4$ | 0 | 0 | 0 | 0 | 0 | 0 | $y^4$ | 0 | 0 | 0 | 1 | 1 | 0 |

Similarly, the prohibited bit patterns, and the substitute patterns with which they are replaced in the right substitution unit 9 are defined in Table 2 below.

TABLE 2

| Prohibited Pattern | | | | | | | | | Substitute Pattern | | | | | | | | |
|---|---|---|---|---|---|---|---|---|---|---|---|---|---|---|---|---|---|
| $y^{11}$ | $y^{12}$ | $y^{13}$ | $y^{14}$ | $y^{16}$ | $y^{16}$ | $y^{17}$ | $y^{18}$ | $y^{19}$ | $y^{11}$ | $y^{12}$ | $y^{13}$ | $y^{14}$ | $y^{15}$ | $y^{16}$ | $y^{17}$ | $y^{18}$ | $y^{19}$ |
| $y^{11}$ | 0 | 1 | 1 | 1 | 0 | 0 | $y^{18}$ | $y^{19}$ | $y^{11}$ | 0 | 1 | 0 | 1 | 1 | 0 | $y^{18}$ | $y^{19}$ |
| $y_n^{11}$ | 0 | 1 | 1 | 1 | 0 | 1 | $y^{18}$ | $y^{19}$ | $y^{11}$ | 0 | 0 | 0 | 1 | 1 | 0 | $y^{18}$ | $y^{19}$ |
| 0 | 0 | 0 | 0 | 0 | 0 | 0 | $y^{18}$ | $y^{19}$ | 0 | 1 | 1 | 0 | 1 | 1 | 0 | $y^{18}$ | $y^{19}$ |
| 0 | 0 | 1 | 1 | 0 | 0 | 1 | 1 | 0 | 0 | 1 | 0 | 0 | 1 | 1 | 0 | 1 | 0 |

In these tables, the patterns marked in bold in the left-hand column are those which are sufficient to determine if a substitution should be performed.

After each substitution unit 8, 9 has detected and replaced any prohibited bit patterns, any violations of the j constraint at subcode word boundaries will have been corrected. In addition, the substitutions reduce k and q to 9 and 14 respectively, thus satisfying the additional constraints defined above. The MTR encoder 4 thus implements a rate 16/19 MTR(2, 9/14) code which, in addition to the high code rate, has a high efficiency. In particular, the efficiency of the code has been computed to be 95.99%. The partitioned block structure allows a particularly simple implementation in the MTR encoder, and hence in the corresponding decoder to be described below. It has been determined that only 369 binary input logic gates are required for implementation of the encoder and decoder. By way of example, a particularly preferred Boolean logic design for the MTR encoder 4 is fully specified at the end of this description.

Figure 3:
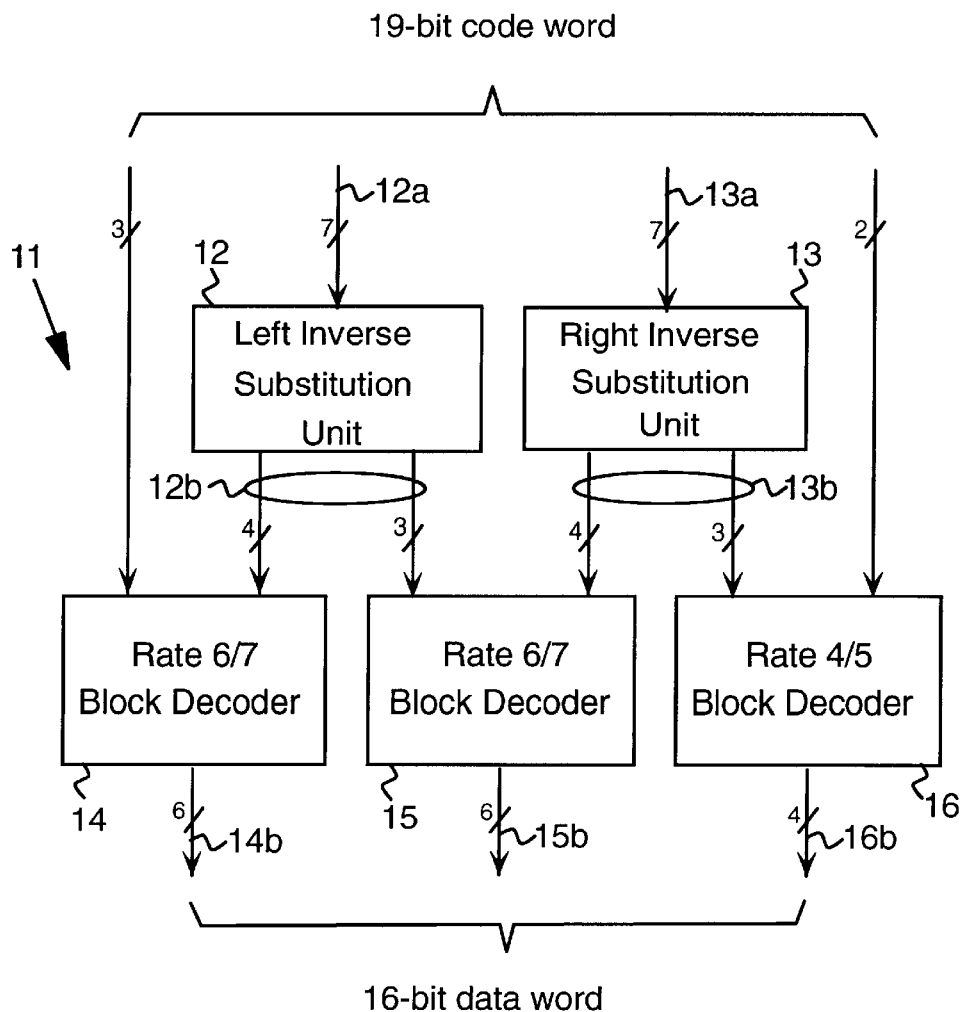
FIG. 3 is a block diagram of a rate 16/19 MTR decoder used in embodiments of the invention.

FIG. 3 illustrates an MTR decoder 11 corresponding to the MTR encoder 4. The operation of the MTR decoder 11 will be apparent to those skilled in the art from the foregoing detailed description of the MTR encoder. Briefly, however, the MTR decoder 11 comprises left and right inverse substitution units 12 and 13 with respective inputs 12a and 13a and outputs 12b and 13b. The bit-lines of the outputs 12b and 13b are connected as shown to first and second rate 6/7 block decoders 14 and 15 and a rate 4/5 block decoder 16. The first three bits of an input 19-bit code word are supplied as indicated to the decoder 14, and the last two bits of the code word are supplied as indicated to the decoder 16. The left inverse substitution unit 12 detects the bit patterns shown on the right-hand side of Table 1 and replaces these by the bit patterns shown on the left-hand side of the table. Similarly, the right-hand substitution unit 13 detects and replaces bit patterns shown on the right-hand side of Table 2 by the patterns shown on the left-hand side of this table. The patterns shown in bold in the right-hand columns of these tables are those which are sufficient to determine if a substitution should be performed. The decoders 14, 15 and 16 perform the inverse mappings of those performed by the encoders 5, 6 and 7 respectively, and outputs 14b, 15b and 16b of the decoders 14, 15 and 16 collectively comprise sixteen bit-lines on which the original 16-bit data word is output in operation. There will of course be occasions when the 17-bit input to the MTR decoder 11 is an illegal code word. In these cases, the MTR decoder output is preferably selected to simplify the decoder logic as far as possible. By way of example, a particularly preferred Boolean logic design for the MTR decoder 11 is fully specified at the end of this description.

Figure 4:
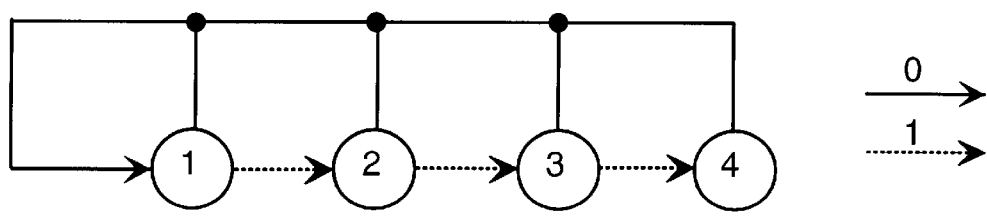
FIG. 4 shows a finite state transition diagram for the MTR j=3 constraint.

The MTR encoder for implementing the second of the two basic MTR codes will now be described with reference to FIGS. 4 to 6. FIG. 4 illustrates the Shannon cover for the MTR j=3 constraint, whereby any sequence generated from this diagram has no more than three consecutive 1's. Reference will be made to this diagram in describing the operation of the MTR encoder shown in FIG. 5.

Figure 5:
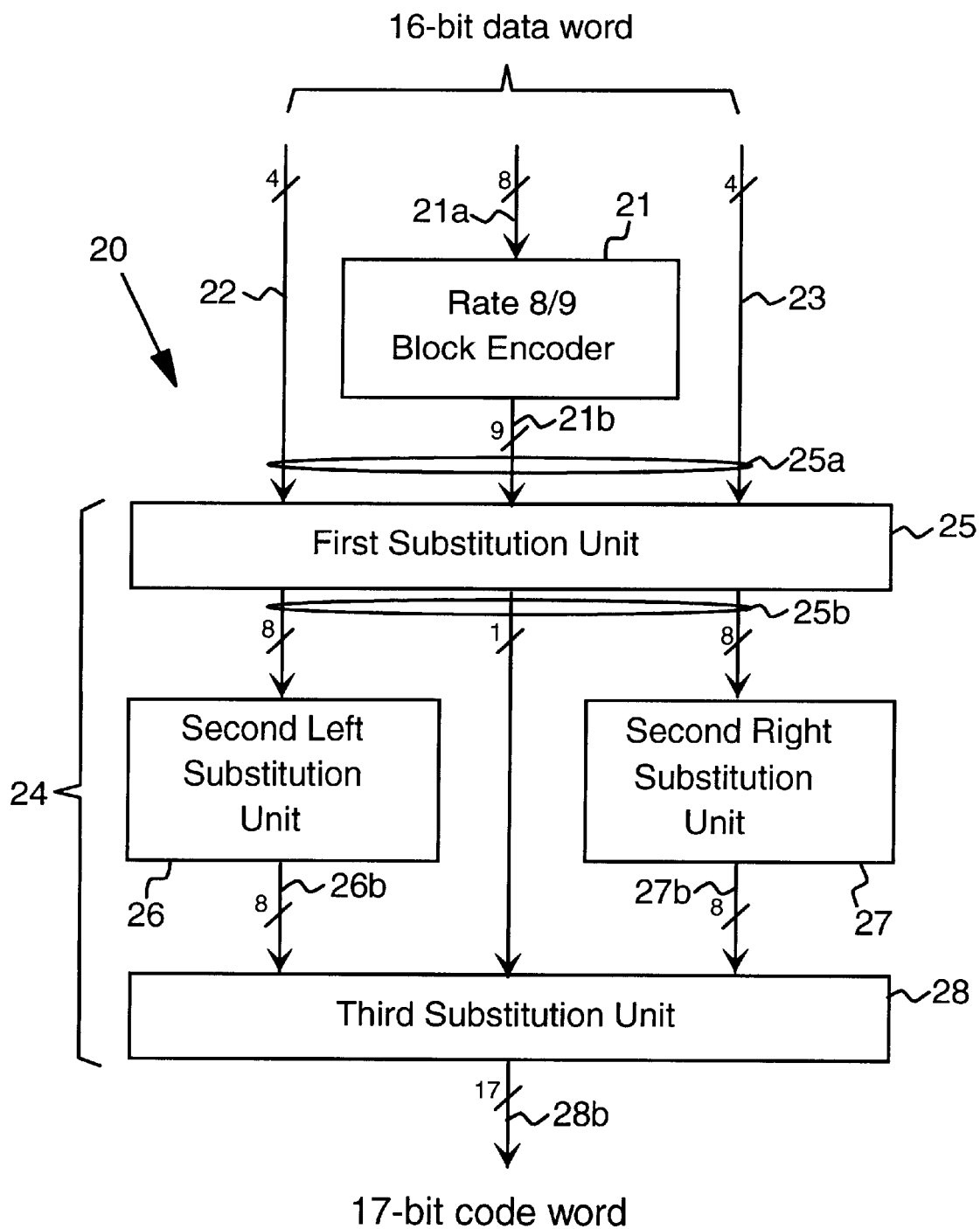
FIG. 5 is a block diagram of a rate 16/17 MTR encoder used in embodiments of the invention.

FIG. 5 shows an MTR encoder 20 which implements a rate 16/17 MTR code for which the maximum number of consecutive 1's in the encoded output is four. However, the locations at which these maximum transition runs can occur in the coded bit-sequence are limited, and for all other locations the maximum number of consecutive 1's is three. More specifically, the code is constructed such that the run of four 1's can occur at bit positions $y^8$, $y^9$, $y^{10}$, $y^{11}$ as well as code word boundaries, i.e. at bit positions $y^{16}$, $y^{17}$, $y^1$, $y^2$. Thus j=4 for two out of the possible seventeen locations, and for all of the other fifteen locations j=3. This code will be referred to herein as an MTR(3/4(2)) code with period l=17, signifying that j=3 except that, in 2 of the 17 possible locations, j=4, and the maximum run of four 1's can occur every l=17 bits. In addition to this j constraint, the code satisfies the additional constraints k=14 and q=22.

As illustrated in the figure, the MTR encoder 20 comprises a rate 8/9 block encoder 21 having an 8-bit input 21a and a 9-bit output 21b. The apparatus has two further 4-bit inputs shown at 22 and 23 which receive the first and last four bits respectively of the input 16-bit data word in use. The violation correction means in this embodiment is indicated generally at 24 and performs three stages of violation correction. The first stage is implemented by a first substitution unit 25 having a 17-bit parallel input 25a made up of the four bit-lines of the input 22, the nine bit-lines of the encoder output 21b, and four bit-lines of the input 23. The first substitution unit 25 has a 17-bit output indicated generally at 25b. The second violation correction stage is implemented by a second left substitution unit 26 and a second right substitution unit 27. The first eight bit-lines of the output 25b of the first substitution unit 25 form the input to the second left substitution unit 26, and the last eight bit-lines of the output 25b form the input to the second right substitution unit 27. This connection of the different groups of bit-lines of the output 25b thus serves to partition the 17-bit sequence into three blocks of eight, one and eight bits respectively, the two 8-bit blocks being supplied to the second left and second right substitution units 26 and 27 as shown. The left and right substitution units 26 and 27 have respective outputs 26b and 27b which, together with the ninth bit-line of the first substitution unit output 25b, form the 17-bit input to the third violation correction stage. This stage is implemented by a third substitution unit 28 having a 17-bit output 28b forming the output of the MTR encoder.

In operation, a 16-bit data word is supplied to the sixteen bit-lines of the inputs 22, 21a and 23 which therefore serve to partition the input word into three blocks of four, eight and four bits respectively. The encoder 21 encodes the 8-bit input block in accordance with a rate 8/9 block code described below to produce a 9-bit subcode word on its output 21b. The resulting bit-sequence derived from the input 16-bit data word and supplied to the input 25a of the first substitution unit is therefore a 17-bit sequence. Violations of the coding constraints are detected and corrected by the three stages of violation correction as detailed below, whereby the 17-bit code word for the input data word appears on the output 28b.

The rate 8/9 code implemented by the encoder 21 is constructed as follows. Referring to FIG. 4, 249 subcode words are obtained by starting in state 3 of this diagram and making nine transitions ending in states 1 or 2. Added to this set of 249 words are six 9-bit subcode words that do not start or end with 11 and have the pattern 011110 at their center. In hexadecimal format these words are 03C, 0BC, 13C, 0BD, 0BD and 13D. The final subcode word is selected as 1EF, that is 111101111. Since each 9-bit subcode word on the encoder output 21b in FIG. 5 is preceded and followed by four uncoded bits at the input 25a to the first substitution unit, there are exactly 256 possible 17-bit sequences that have the 9-bit subcode word 1EF at their center, i.e. at bit-positions $y^5$ to $y^{13}$. All these sequences are detected as prohibited bit sequences by the first substitution unit 25 and replaced by respective substitute bit patterns in accordance with Table 3 below. Again, in the following tables the bold patterns are those which are sufficient to determine if substitution, or inverse substitution, should be performed.

TABLE 3

Prohibited Pattern

| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|---|---|---|---|---|---|---|---|---|
| 0 | 0 | 0 | 1 | 1 | 1 | 1 | 1 | 0 | 1 | 1 | 1 | 1 | $y^{14}$ | $y^{15}$ | $y^{16}$ | $y^{17}$ |
| 0 | 0 | 1 | 1 | 1 | 1 | 1 | 1 | 0 | 1 | 1 | 1 | 1 | $y^{14}$ | $y^{15}$ | $y^{16}$ | $y^{17}$ |
| 0 | 1 | 0 | 1 | 1 | 1 | 1 | 1 | 0 | 1 | 1 | 1 | 1 | $y^{14}$ | $y^{15}$ | $y^{16}$ | $y^{17}$ |
| 0 | 1 | 1 | 1 | 1 | 1 | 1 | 1 | 0 | 1 | 1 | 1 | 1 | $y^{14}$ | $y^{15}$ | $y^{16}$ | $y^{17}$ |
| 1 | 0 | 0 | 1 | 1 | 1 | 1 | 1 | 0 | 1 | 1 | 1 | 1 | $y^{14}$ | $y^{15}$ | $y^{16}$ | $y^{17}$ |
| 1 | 0 | 1 | 1 | 1 | 1 | 1 | 1 | 0 | 1 | 1 | 1 | 1 | $y^{14}$ | $y^{15}$ | $y^{16}$ | $y^{17}$ |
| 1 | 1 | 0 | 1 | 1 | 1 | 1 | 1 | 0 | 1 | 1 | 1 | 1 | $y^{14}$ | $y^{15}$ | $y^{16}$ | $y^{17}$ |
| 1 | 1 | 1 | 1 | 1 | 1 | 1 | 1 | 0 | 1 | 1 | 1 | 1 | $y^{14}$ | $y^{15}$ | $y^{16}$ | $y^{17}$ |
| $y^1$ | $y^2$ | $y^3$ | 0 | 1 | 1 | 1 | 1 | 0 | 1 | 1 | 1 | 1 | $y^{14}$ | 0 | 0 | 0 |
| $y^1$ | $y^2$ | $y^3$ | 0 | 1 | 1 | 1 | 1 | 0 | 1 | 1 | 1 | 1 | $y^{14}$ | 1 | 0 | 0 |
| $y^1$ | $y^2$ | $y^3$ | 0 | 1 | 1 | 1 | 1 | 0 | 1 | 1 | 1 | 1 | $y^{14}$ | 0 | 1 | 0 |
| $y^1$ | $y^2$ | $y^3$ | 0 | 1 | 1 | 1 | 1 | 0 | 1 | 1 | 1 | 1 | $y^{14}$ | 1 | 1 | 0 |
| $y^1$ | $y^2$ | $y^3$ | 0 | 1 | 1 | 1 | 1 | 0 | 1 | 1 | 1 | 1 | $y^{14}$ | 0 | 0 | 1 |
| $y^1$ | $y^2$ | $y^3$ | 0 | 1 | 1 | 1 | 1 | 0 | 1 | 1 | 1 | 1 | $y^{14}$ | 1 | 0 | 1 |
| $y^1$ | $y^2$ | $y^3$ | 0 | 1 | 1 | 1 | 1 | 0 | 1 | 1 | 1 | 1 | $y^{14}$ | 0 | 1 | 1 |
| $y^1$ | $y^2$ | $y^3$ | 0 | 1 | 1 | 1 | 1 | 0 | 1 | 1 | 1 | 1 | $y^{14}$ | 1 | 1 | 1 |

Substitute Pattern

| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|---|---|---|---|---|---|---|---|---|
| 0 | 1 | 1 | 0 | 1 | 1 | 0 | 1 | 1 | 0 | 0 | 0 | 0 | $y^{14}$ | $y^{15}$ | $y^{16}$ | $y^{17}$ |
| 0 | 1 | 1 | 0 | 1 | 1 | 0 | 1 | 1 | 0 | 0 | 0 | 1 | $y^{14}$ | $y^{15}$ | $y^{16}$ | $y^{17}$ |
| 0 | 1 | 1 | 0 | 1 | 1 | 0 | 1 | 1 | 0 | 0 | 1 | 0 | $y^{14}$ | $y^{15}$ | $y^{16}$ | $y^{17}$ |
| 0 | 1 | 1 | 0 | 1 | 1 | 0 | 1 | 1 | 0 | 1 | 0 | 1 | $y^{14}$ | $y^{15}$ | $y^{16}$ | $y^{17}$ |
| 0 | 1 | 1 | 0 | 1 | 1 | 0 | 1 | 1 | 1 | 0 | 0 | 0 | $y^{14}$ | $y^{15}$ | $y^{16}$ | $y^{17}$ |
| 0 | 1 | 1 | 0 | 1 | 1 | 0 | 1 | 1 | 1 | 0 | 0 | 1 | $y^{14}$ | $y^{15}$ | $y^{16}$ | $y^{17}$ |
| 0 | 1 | 1 | 0 | 1 | 1 | 0 | 1 | 1 | 1 | 0 | 1 | 0 | $y^{14}$ | $y^{15}$ | $y^{16}$ | $y^{17}$ |
| 0 | 1 | 1 | 0 | 1 | 1 | 0 | 1 | 1 | 0 | 1 | 0 | 0 | $y^{14}$ | $y^{15}$ | $y^{16}$ | $y^{17}$ |
| $y^1$ | $y^2$ | $y^3$ | $y^4$ | 0 | 0 | 0 | 0 | 1 | 1 | 0 | 1 | 1 | 0 | 1 | 1 | 0 |
| $y^1$ | $y^2$ | $y^3$ | $y^4$ | 1 | 0 | 0 | 0 | 1 | 1 | 0 | 1 | 1 | 0 | 1 | 1 | 0 |
| $y^1$ | $y^2$ | $y^3$ | $y^4$ | 0 | 1 | 0 | 0 | 1 | 1 | 0 | 1 | 1 | 0 | 1 | 1 | 0 |
| $y^1$ | $y^2$ | $y^3$ | $y^4$ | 1 | 0 | 1 | 0 | 1 | 1 | 0 | 1 | 1 | 0 | 1 | 1 | 0 |
| $y^1$ | $y^2$ | $y^3$ | $y^4$ | 0 | 0 | 0 | 1 | 1 | 1 | 0 | 1 | 1 | 0 | 1 | 1 | 0 |
| $y^1$ | $y^2$ | $y^3$ | $y^4$ | 1 | 0 | 0 | 1 | 1 | 1 | 0 | 1 | 1 | 0 | 1 | 1 | 0 |
| $y^1$ | $y^2$ | $y^3$ | $y^4$ | 0 | 1 | 0 | 1 | 1 | 1 | 0 | 1 | 1 | 0 | 1 | 1 | 0 |
| $y^1$ | $y^2$ | $y^3$ | $y^4$ | 0 | 0 | 1 | 0 | 1 | 1 | 0 | 1 | 1 | 0 | 1 | 1 | 0 |

The first eight bits of the 17-bit sequence output by the first substitution unit 2 are received by the second left substitution unit 26 which detects and replaces prohibited bit patterns in accordance with Table 4 below.

TABLE 4

| Prohibited Pattern | | | | | | | | Substitute Pattern | | | | | | | |
|---|---|---|---|---|---|---|---|---|---|---|---|---|---|---|---|
| $y^1$ | $y^2$ | $y^3$ | $y^4$ | $y^5$ | $y^6$ | $y^7$ | $y^8$ | $y^1$ | $y^2$ | $y^3$ | $y^4$ | $y^5$ | $y^6$ | $y^7$ | $y^8$ |
| 1 | 1 | 1 | 1 | 1 | 0 | $y^7$ | $y^8$ | 1 | 1 | 0 | $y^7$ | 1 | 1 | 0 | $y^8$ |
| 1 | 1 | 1 | 1 | 0 | 1 | 1 | $y^8$ | $y^8$ | 0 | 1 | 0 | 1 | 1 | 1 | 0 |
| 1 | 1 | 1 | 1 | 0 | 0 | 1 | $y^8$ | 0 | 1 | 0 | 1 | 1 | 1 | 0 | $y^8$ |
| 1 | 1 | 1 | 1 | 0 | 1 | 0 | $y^8$ | 1 | 0 | 0 | 1 | 1 | 1 | 0 | $y^8$ |
| 1 | 1 | 1 | 1 | 0 | 0 | 0 | $y^8$ | 0 | 0 | 0 | 1 | 1 | 1 | 0 | $y^8$ |
| 1 | 1 | 1 | 0 | 0 | 0 | $y^7$ | $y^8$ | 0 | 0 | $y^7$ | 0 | 1 | 1 | 0 | $y^8$ |
| 1 | 1 | 1 | 0 | 0 | 1 | $y^7$ | $y^8$ | 0 | 1 | $y^7$ | 0 | 1 | 1 | 0 | $y^8$ |
| 1 | 1 | 1 | 0 | 1 | 0 | $y^7$ | $y^8$ | 1 | 0 | $y^7$ | 0 | 1 | 1 | 0 | $y^8$ |

TABLE 4-continued

| Prohibited Pattern | | | | | | | | Substitute Pattern | | | | | | | |
|---|---|---|---|---|---|---|---|---|---|---|---|---|---|---|---|
| $y^1$ | $y^2$ | $y^3$ | $y^4$ | $y^5$ | $y^6$ | $y^7$ | $y^8$ | $y^1$ | $y^2$ | $y^3$ | $y^4$ | $y^5$ | $y^6$ | $y^7$ | $y^8$ |
| 0 | 1 | 1 | 1 | 1 | 0 | $y^7$ | $y^8$ | $y^7$ | $y^8$ | 0 | 0 | 1 | 1 | 1 | 0 |
| 0 | 0 | 0 | 0 | 0 | 0 | 0 | 0 | 0 | 1 | 1 | 0 | 1 | 1 | 1 | 0 |

The last eight bits of the 17-bit sequence output by the first substitution unit 2 are received by the second right substitution unit 27 which detects and replaces prohibited bit patterns in accordance with Table 5 below. It will be seen that Table 5 is a mirror image of Table 4.

TABLE 5

| Prohibited Pattern | | | | | | | | Substitute Pattern | | | | | | | |
|---|---|---|---|---|---|---|---|---|---|---|---|---|---|---|---|
| $y^{10}$ | $y^{11}$ | $y^{12}$ | $y^{13}$ | $y^{14}$ | $y^{15}$ | $y^{16}$ | $y^{17}$ | $y^{10}$ | $y^{11}$ | $y^{12}$ | $y^{13}$ | $y^{14}$ | $y^{15}$ | $y^{16}$ | $y^{17}$ |
| $y^{10}$ | $y^{11}$ | 0 | 1 | 1 | 1 | 1 | 1 | $y^{10}$ | 0 | 1 | 1 | $y_n^{11}$ | 0 | 1 | 1 |
| $y^{10}$ | 1 | 1 | 0 | 1 | 1 | 1 | 1 | 0 | 1 | 1 | 1 | 0 | 1 | 0 | $y^{10}$ |
| $y^{10}$ | 1 | 0 | 0 | 1 | 1 | 1 | 1 | $y^{10}$ | 0 | 1 | 1 | 1 | 0 | 1 | 0 |
| $y^{10}$ | 0 | 1 | 0 | 1 | 1 | 1 | 1 | $y^{10}$ | 0 | 1 | 1 | 1 | 0 | 0 | 1 |
| $y^{10}$ | 0 | 0 | 0 | 1 | 1 | 1 | 1 | $y^{10}$ | 0 | 1 | 1 | 1 | 0 | 0 | 0 |
| $y^{10}$ | $y^{11}$ | 0 | 0 | 0 | 1 | 1 | 1 | $y^{10}$ | 0 | 1 | 1 | 0 | $y^{11}$ | 0 | 0 |
| $y^{10}$ | $y^{11}$ | 1 | 0 | 0 | 1 | 1 | 1 | $y^{10}$ | 0 | 1 | 1 | 0 | $y^{11}$ | 1 | 0 |
| $y^{10}$ | $y^{11}$ | 0 | 1 | 0 | 1 | 1 | 1 | $y^{10}$ | 0 | 1 | 1 | 0 | $y^{11}$ | 0 | 1 |
| $y^{10}$ | $y^{11}$ | 0 | 1 | 1 | 1 | 1 | 0 | 0 | 1 | 1 | 1 | 0 | 0 | $y^{10}$ | $y^{11}$ |
| 0 | 0 | 0 | 0 | 0 | 0 | 0 | 0 | 0 | 1 | 1 | 1 | 0 | 1 | 1 | 0 |

After the second stage of violation correction the third substitution unit 28 detects and replaces prohibited bit patterns in its 17-bit input in accordance with Table 6 below.

TABLE 6

| Prohibited Pattern | | | | | | | | | | | | | | | | |
|---|---|---|---|---|---|---|---|---|---|---|---|---|---|---|---|---|
| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
| 0 | 0 | 1 | 1 | 0 | 0 | 1 | 1 | 0 | 0 | 1 | 1 | $y^{13}$ | $y^{14}$ | $y^{15}$ | $y^{16}$ | $y^{17}$ |
| 0 | 1 | 1 | 0 | 0 | 1 | 1 | 0 | 0 | 1 | 1 | 0 | $y^{13}$ | $y^{14}$ | $y^{15}$ | $y^{16}$ | $y^{17}$ |
| 1 | 1 | 0 | 0 | 1 | 1 | 0 | 0 | 1 | 1 | 0 | 0 | $y^{13}$ | $y^{14}$ | $y^{15}$ | $y^{16}$ | $y^{17}$ |
| 1 | 0 | 0 | 1 | 1 | 0 | 0 | 1 | 1 | 0 | 0 | 1 | $y^{13}$ | $y^{14}$ | $y^{15}$ | $y^{16}$ | $y^{17}$ |
| $y^1$ | $y^2$ | $y^3$ | $y^4$ | $y^5$ | 1 | 1 | 0 | 0 | 1 | 1 | 0 | 0 | 1 | 1 | 0 | 0 |
| $y^1$ | $y^2$ | $y^3$ | $y^4$ | $y^5$ | 0 | 1 | 1 | 0 | 0 | 1 | 1 | 0 | 0 | 1 | 1 | 0 |
| $y^1$ | $y^2$ | $y^3$ | $y^4$ | $y^5$ | 0 | 0 | 1 | 1 | 0 | 0 | 1 | 1 | 0 | 0 | 1 | 1 |
| $y^1$ | $y^2$ | $y^3$ | $y^4$ | $y^5$ | 1 | 0 | 0 | 1 | 1 | 0 | 0 | 1 | 1 | 0 | 0 | 1 |
| 1 | 0 | 0 | 0 | 0 | 0 | 0 | 0 | 0 | 0 | 0 | 0 | 0 | 0 | 0 | 0 | 1 |

| Substitute Pattern | | | | | | | | | | | | | | | | |
|---|---|---|---|---|---|---|---|---|---|---|---|---|---|---|---|---|
| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
| 1 | 0 | 1 | 0 | 1 | 1 | 1 | 0 | 1 | 0 | 1 | 0 | $y^{13}$ | $y^{14}$ | $y^{15}$ | $y^{16}$ | $y^{17}$ |
| 1 | 0 | 1 | 0 | 1 | 1 | 1 | 0 | 1 | 1 | 1 | 0 | $y^{13}$ | $y^{14}$ | $y^{15}$ | $y^{16}$ | $y^{17}$ |
| 1 | 0 | 1 | 0 | 1 | 1 | 1 | 0 | 1 | 1 | 0 | 0 | $y^{13}$ | $y^{14}$ | $y^{15}$ | $y^{16}$ | $y^{17}$ |
| 1 | 0 | 1 | 0 | 1 | 1 | 1 | 0 | 1 | 0 | 0 | 1 | $y^{13}$ | $y^{14}$ | $y^{15}$ | $y^{16}$ | $y^{17}$ |
| $y^1$ | $y^2$ | $y^3$ | $y^4$ | $y^5$ | 0 | 1 | 0 | 1 | 0 | 1 | 1 | 1 | 0 | 1 | 0 | 1 |
| $y^1$ | $y^2$ | $y^3$ | $y^4$ | $y^5$ | 0 | 1 | 1 | 1 | 0 | 1 | 1 | 1 | 0 | 1 | 0 | 1 |
| $y^1$ | $y^2$ | $y^3$ | $y^4$ | $y^5$ | 0 | 0 | 1 | 1 | 0 | 1 | 1 | 1 | 0 | 1 | 0 | 1 |
| $y^1$ | $y^2$ | $y^3$ | $y^4$ | $y^5$ | 1 | 0 | 0 | 1 | 0 | 1 | 1 | 1 | 0 | 1 | 0 | 1 |
| 1 | 1 | 0 | 1 | 1 | 1 | 0 | 1 | 1 | 1 | 0 | 0 | 0 | 0 | 0 | 0 | 1 |

After any prohibited bit patterns have been detected and replaced by the three stages of violation correction, any violations of the j constraint will have been corrected. In addition, the substitutions reduce k and q to 11 and 22 respectively. The MTR encoder 20 thus implements a rate 16/17 MTR(3/4(2), 14/22) code with period l=17 which has a high efficiency in addition to the high code rate. A lower bound on the efficiency of the code has been computed to be 99.03%. Again, the partitioned block structure allows a particularly simple implementation in the MTR encoder, and hence in the corresponding decoder described below. It has been determined that the encoder and decoder can be implemented with only 713 binary input logic gates. By way of example, a particularly preferred Boolean logic design for the MTR encoder 20 is fully specified at the end of this description.

Figure 6:
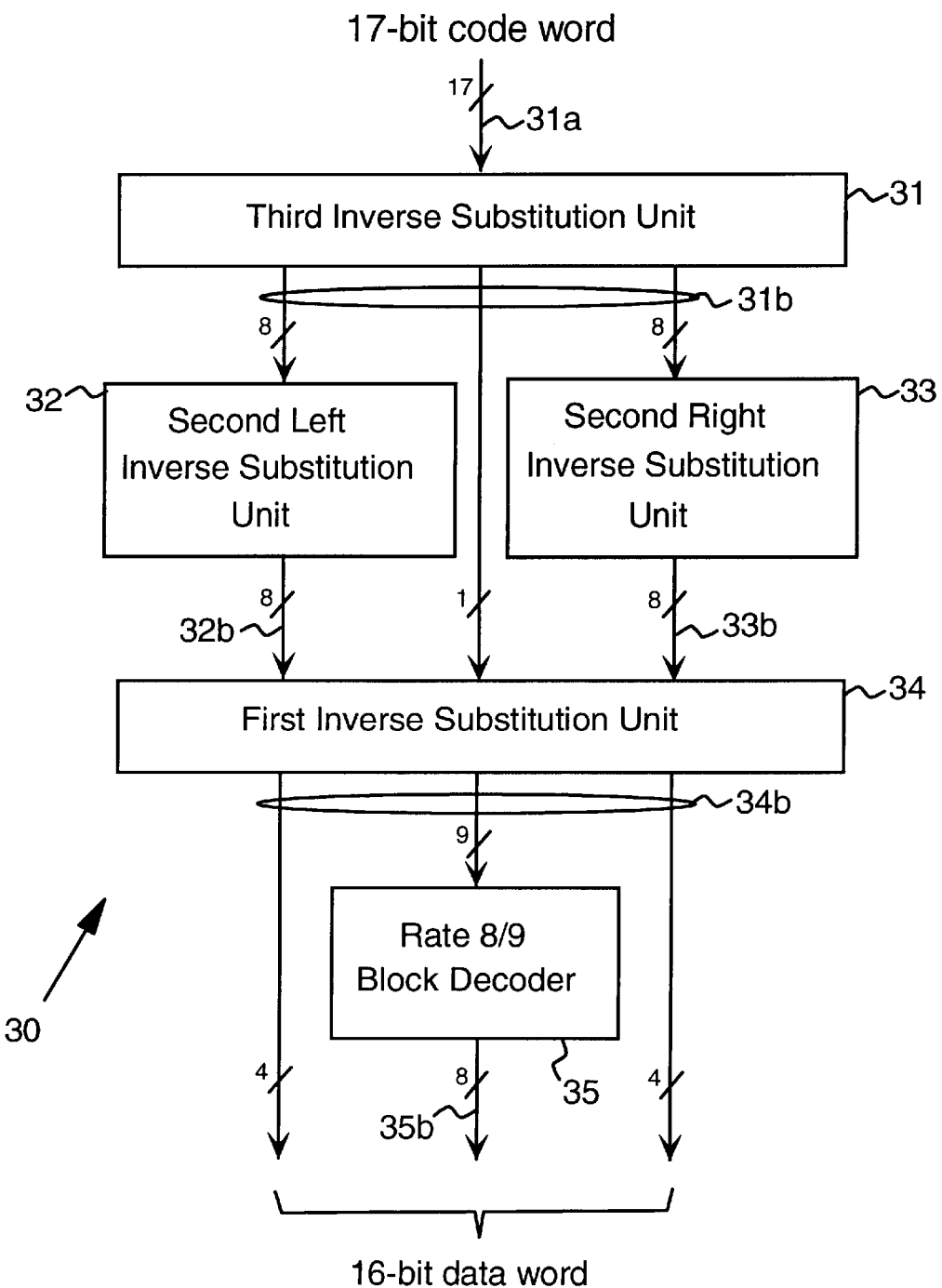
FIG. 6 is a block diagram of a rate 16/17 MTR decoder used in embodiments of the invention.

FIG. 6 illustrates the MTR decoder 30 corresponding to the MTR encoder 20 of FIG. 5. Again, the operation of the MTR decoder will be apparent to those skilled in the art from the foregoing description of the encoding process. Briefly, however, the MTR decoder 30 comprises three stages of inverse substitution corresponding to the three violation correction stages of the MTR encoder 20. A third inverse substitution unit 31 has a 17-bit input 31a and a 17-bit output 31b which is partitioned as shown into groups of eight, four and eight bit-lines respectively. This inverse substitution unit detects and replaces the bit patterns shown on the right-hand side of Table 6 with the patterns shown on the left-hand side of this table. The second stage of inverse substitution is implemented by second left and second right inverse substitution units 32 and 33 having respective 8-bit outputs 32b and 33b. The unit 32 detects and replaces the bit patterns shown on the right-hand side of Table 4 with the patterns shown on the left-hand side of this table. Similarly, the unit 33 performs the inverse substitutions defined by Table 5. The outputs 32b and 33b, together with the central bit line of the output 31b of the third inverse substitution unit, form the input to the final inverse substitution stage. This is implemented by a first inverse substitution unit 34 which performs the inverse substitutions defined in Table 3. A 17-bit output 34b of the unit 34 is partitioned as shown into groups of four, nine and four bit-lines respectively. The group of nine bit-lines forms the input to a rate 8/9 block decoder 35 which performs the inverse mappings to those performed by the block encoder 21 in FIG. 5. The 8-bit output 35b of the block decoder, together with the two groups of four bit-lines from the inverse substitution unit 34, form the 16-bit output on which the original 16-bit data word is output in operation. As before, the MTR decoder output in the case of illegal input code words is selected so as to simplify the decoder logic as far as possible. By way of example, a particularly preferred Boolean logic design for the MTR decoder 30 is fully specified at the end of this description.

A data storage system embodying the invention will now be described with reference to FIG. 7. As illustrated, the data storage system includes encoder apparatus in the form of MTR/parity encoder 40 which receives successive M-bit data words for encoding. The input data to be recorded is generally initially in the form of a Reed-Solomon encoded bit-stream and is serial-to-parallel converted to produce the M-bit data words supplied to the MTR/parity encoder 40. The MTR/parity encoder (which incorporates a partial response precoder in this embodiment as described in detail below) encodes each M-bit data word to produce an N-bit code word. The succession of N-bit code words output by encoder 40 is supplied to a magnetic recording channel wherein, after write-precompensation 41, the analogue recording waveform is recorded on the magnetic recording medium, here disk 42, by read/write (R/W) head 43. When the recorded magnetization pattern is subsequently read from disk by head 43, the reproduced signal is subjected to the usual signal processing indicated generally by block 44 (typically preamplification, automatic gain control, low-pass filtering, sampling and partial response equalization). The reproduced data output by processing block 44 is supplied to reproduction processing apparatus, indicated generally at 45, comprising a detector 46 and decoding apparatus in the form of an MTR/parity decoder 47. The structure and operation of detector 46 and MTR/parity decoder 47 are described in detail below. Briefly, however, detector 46 processes the reproduced data to detect successive N-bit code words. The stream of N-bit code words is then decoded by MTR/parity decoder 47 to recover the original data. The resulting data is generally then subjected to Reed-Solomon decoding for further error correction.

In the following, two families of MTR/parity encoders which may be used as the encoder 40 in the system of FIG. 7 will be described. The first family of encoders implement rate M/N MTR j=3/4 codes, where M=(64n+32), N=(68n+36) and n=0, 1, 2, . . . . In family of encoders, the MTR coding scheme used in the first encoding stage uses the rate 16/17 MTR(3/4(2), 14/22) code detailed above as the mother code, and the code rate approaches 16/17 from below as n→∞. FIG. 8 illustrates a preferred embodiment of such an MTR/parity encoder for the case where n=1. In this embodiment, the MTR/parity encoder 40a thus implements a rate 96/104 MTR/parity j=3/4 code. As illustrated, the MTR/parity encoder 40a comprises a first encoder, indicated generally at 50, and a second encoder, indicated generally at 51. The first encoder 50 consists of six rate 16/17 MTR encoders 20 each having a sixteen-bit input 53 and a seventeen-bit output 54. The construction and operation of each rate 16/17 MTR encoder 20 is as described above with reference to FIG. 5. The six outputs 54 of the MTR encoders 20 form the inputs to the second encoder 51. This consists of a parity encoder 55, a further encoder in the form of rate 36/36 block encoder 56, a parallel-to-serial converter (P/S) 57 and a $1/(1 \oplus D)$ precoder 58, connected as shown in the figure.

In operation, the first encoder 50 encodes each input (M=96)-bit data word to produce a (G=102)-bit word which is supplied to the second encoder 51. The 96 bits of the input data word are supplied to the six inputs 53 of MTR encoders 20 which therefore serve to partition the input word into six m-bit blocks, where m=16 here. These blocks are denoted in the figure by the arrays a[1:16], a[17:32], . . . , a[81:96]. (The array notation used here and in the following is such that $x_r$, $1 \le r \le z$, denotes the $r^{th}$ bit in the array x[1:z] where $x_1$ is the least recent bit and $x_z$ the most recent bit). Each of these blocks is then encoded by the corresponding MTR encoder 20 as described in detail above to produce an output g-bit block where g=17 here. The 17-bit blocks on outputs 54 of the MTR encoders 20 are denoted in the figure by b[1:17], b[18:34], . . . , b[86:102], and together constitute the (G=102)-bit word output by the first encoder 50. The result of the MTR coding scheme collectively implemented by MTR encoders 20 is thus a 102-bit word which satisfies an MTR $j=j_1$ constraint, where $j_1=3/4$, together with the constraints on k and q as described above.

The second encoder 51 then implements a second coding scheme to encode the (G=102)-bit word into an (N=104)-bit code word. In more detail, the outputs 54 of MTR encoders 20 are supplied to parity encoder 55 which generates two parity bits from the input bit values. The two parity bits are inserted at specific locations in the 102-bit word to produce a 104-bit parity-coded word denoted by c[1:104] in the figure. Specifically:

$$c_i = b_i \text{ for } 1 \le i \le 82, \quad (1)$$

$$c_i = b_{i-1} \text{ for } 84 \le i \le 89, \quad (2)$$

$$c_i = b_{i-2} \text{ for } 91 \le i \le 104, \quad (3)$$

and $c_{83}$ and $c_{90}$ are parity bits that are accumulated based on the parity equations $$\bigoplus_{i=0}^{25} (c_{3+4i} \oplus c_{4+4i}) = 0, \quad (4)$$

and $$\bigoplus_{i=0}^{51} c_{2+2i} = 0, \quad (5)$$

respectively. The effect of this parity coding is to ensure that the final output 104-bit code word satisfies a particular parity condition defined below, without eliminating the MTR constraints. However, the MTR j constraint is loosened as a result of the parity-coding. In particular, while the parity coding here is such that the parity-coded words c[1:104] still satisfy a j=3/4 constraint, the maximum run of j=4 consecutive 1's can occur more frequently, i.e. at more bit locations. Thus if the parity-coded words were supplied directly to the precoder 58, the maximum run of $j_2$=4 consecutive bit-value transitions could occur more often in the set of possible output code words. Accordingly, the parity-coded word c[1:104] is subjected to a block coding step to improve the j constraint by eliminating some of the occurrences of four consecutive transitions in the output code words. Specifically, the most recent thirty-six bits c[69:104] of the parity-coded word are supplied to block encoder 56 which implements a rate 36/36 block code to produce further-coded word d[1:104] from the parity-code word c[1:104]. The block coding is also such that parity equations (4) and (5) are preserved, i.e. these equations are also satisfied by d[1:104]. The rate 36/36 code implemented by block encoder 56 is defined by the following Boolean equations relating d[1:104] to c[1:104], where the operations addition, multiplication, ED and overbar stand for the Boolean operations "or", "and", "xor" and negation respectively. Furthermore, it is assumed that negation has the highest priority and the "and" operation has a higher priority than the "or" operation.

$$d_i = c_i \text{ for } 1 \leq i \leq 78, \text{ and } i=80, 84, 89, \text{ and } 93 \leq i \leq 104, \quad (6)$$

and $$q_1 = c_{81} c_{82} c_{83} c_{84} \quad (7)$$

$$q_2 = c_{89} c_{90} c_{91} c_{92} \quad (8)$$

$$s_1 = q_1 \bar{q}_2 \quad (9)$$

$$s_2 = \bar{q}_1 q_2 \quad (10)$$

$$s_3 = q_1 q_2 \quad (11)$$

$$s_4 = \bar{q}_1 \bar{q}_2 \quad (12)$$

$$s_5 = s_1 + s_3 \quad (13)$$

$$s_6 = s_2 + s_3 \quad (14)$$

$$d_{79} = c_{79} \bar{s}_1 + (\bar{c}_{79} \oplus c_{87}) s_1 \quad (15)$$

$$d_{81} = c_{81} \bar{s}_1 + c_{87} s_1 \quad (16)$$

$$d_{82} = c_{82} \bar{s}_5 + c_{86} s_5 \quad (17)$$

$$d_{83} = c_{83} \bar{s}_5 \quad (18)$$

$$d_{85} = c_{85} + s_5 \quad (19)$$

$$d_{86} = c_{86} s_4 + s_1 \quad (20)$$

$$d_{87} = c_{87} s_4 + s_6 \quad (21)$$

$$d_{88} = c_{88} + s_6 \quad (22)$$

$$d_{90} = c_{90} s_6 \quad (23)$$

$$d_{91} = c_{91} \bar{s}_6 + (\bar{c}_{86} \oplus c_{87}) s_2 + \bar{c}_{87} s_3 \quad (24)$$

$$d_{92} = c_{92} \bar{s}_6 + \bar{c}_{86} s_2 \quad (25)$$

d[1:104] is then serialized by P/S converter 57 and fed to the precoder 58 which outputs u[1:104] where:

$$u_i = u_{i-1} \oplus d_i \quad (26)$$

The precoder 58 thus maps input bits $d_i$ of value "1" to output bits $u_i$ which are of different value to the immediately preceding bit $u_{i-1}$, so that 1's are effectively mapped to bit-value transitions. Overall therefore, it will be seen that the second encoder 51 serves to implement the parity coding while maintaining an MTR constraint, and to map bits of value "1" in the input (G=102)-bit word (specifically those bits which are unaffected by the block coding) to bit-value transitions in the output (N=104)-bit code word. Thus, u[1:104] constitutes the 104-bit code word output by the MTR/parity encoder 40a. The output code word satisfies an MTR $j=j_2$ constraint, where $j_2=j_1=3/4$, together with a parity condition resulting from the earlier parity coding. This parity condition is defined by the following two equations:

$$\bigoplus_{i=0}^{51} u_{1+2i} = 0, \quad (27)$$

and $$\bigoplus_{i=0}^{51} u_{2+2i} = 0 \quad (28)$$

This parity condition is exploited by the detector of the reproduction processing apparatus as described in detail below. Thus, the encoding has been performed in such a manner that a parity condition has been imposed while maintaining an MTR j=3/4 constraint. Moreover, the quantities k and q defined earlier are still constrained in the output code words, though the constraints are less stringent than for the basic rate 16/17 MTR mother code.

Figure 7:
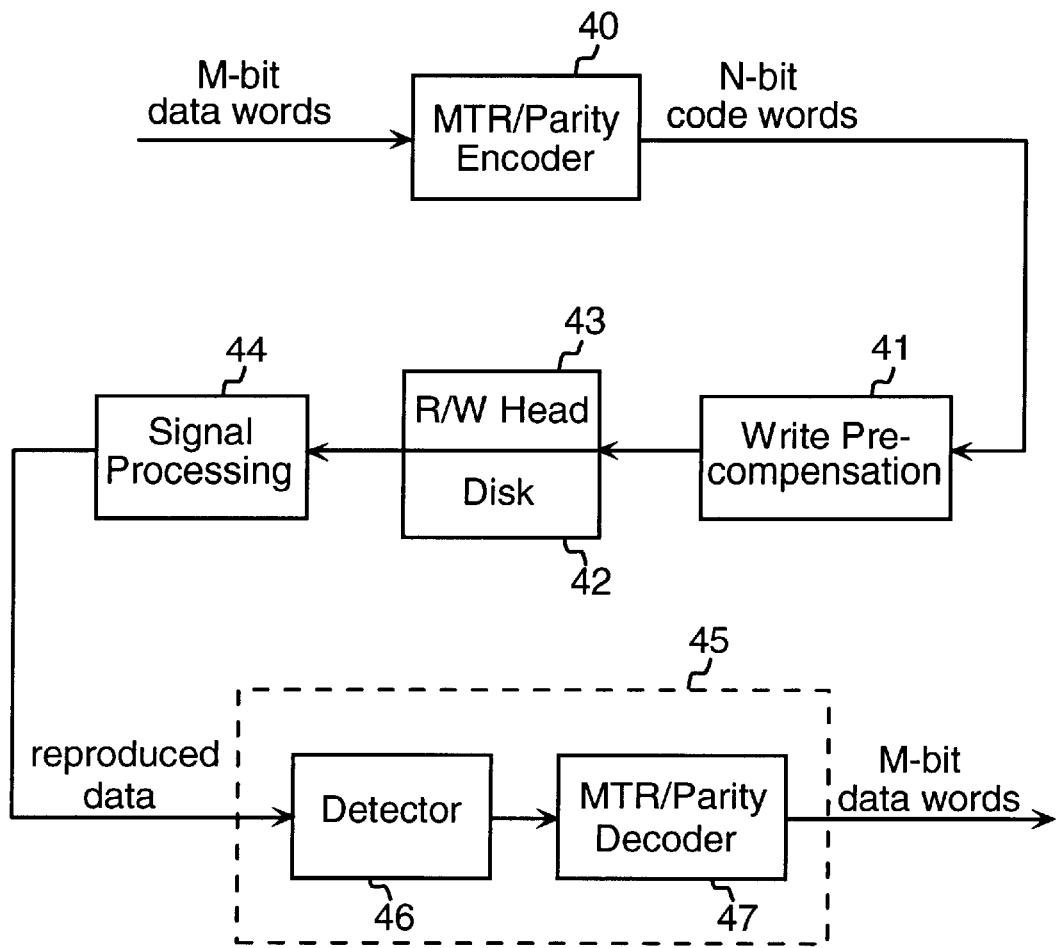
FIG. 7 is a simplified block diagram of a data storage system embodying the invention.
Figure 8:
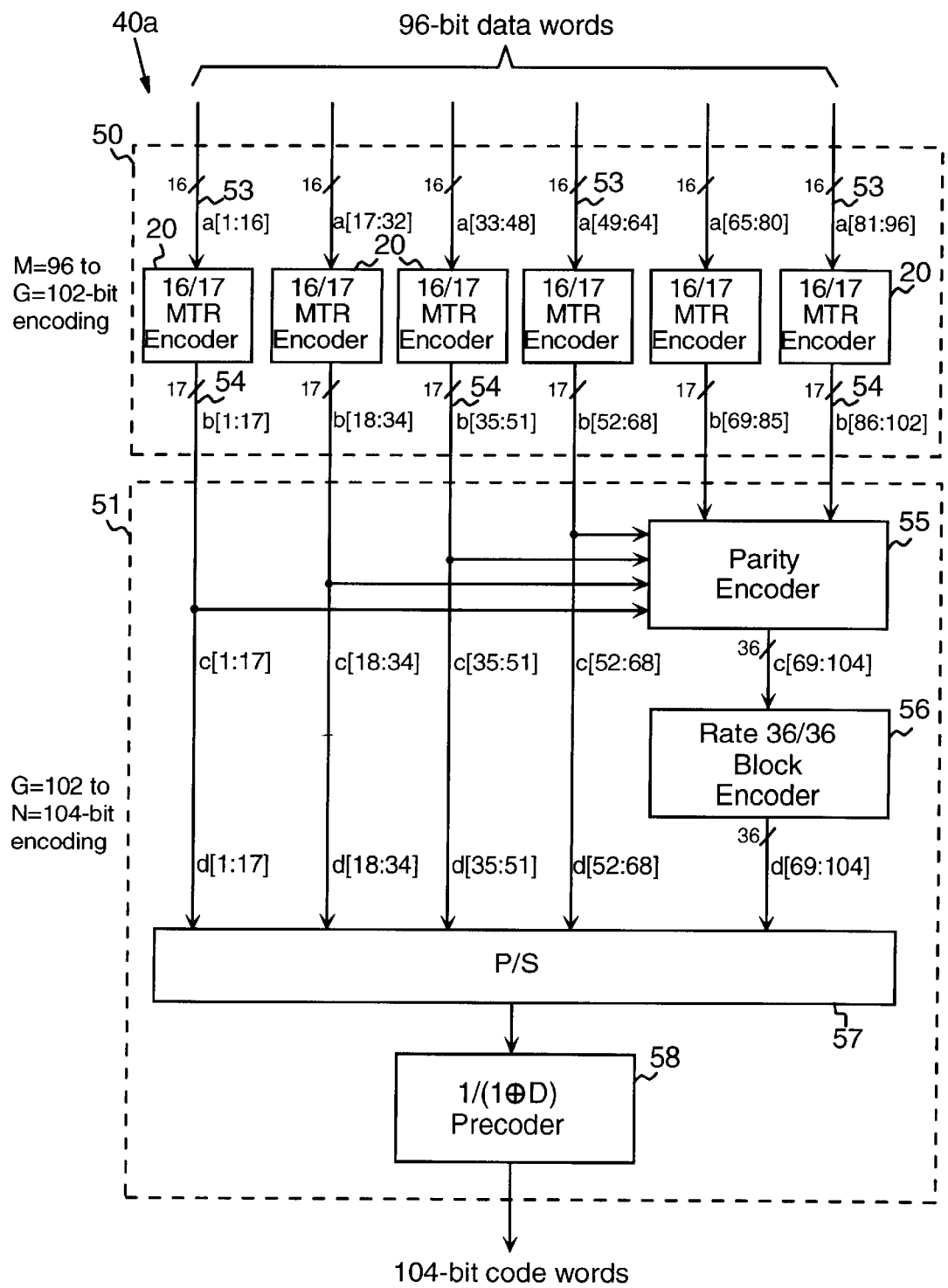
FIG. 8 is a more detailed block diagram of one embodiment of the MTR/parity encoder of the FIG. 7 system.
Figure 9:
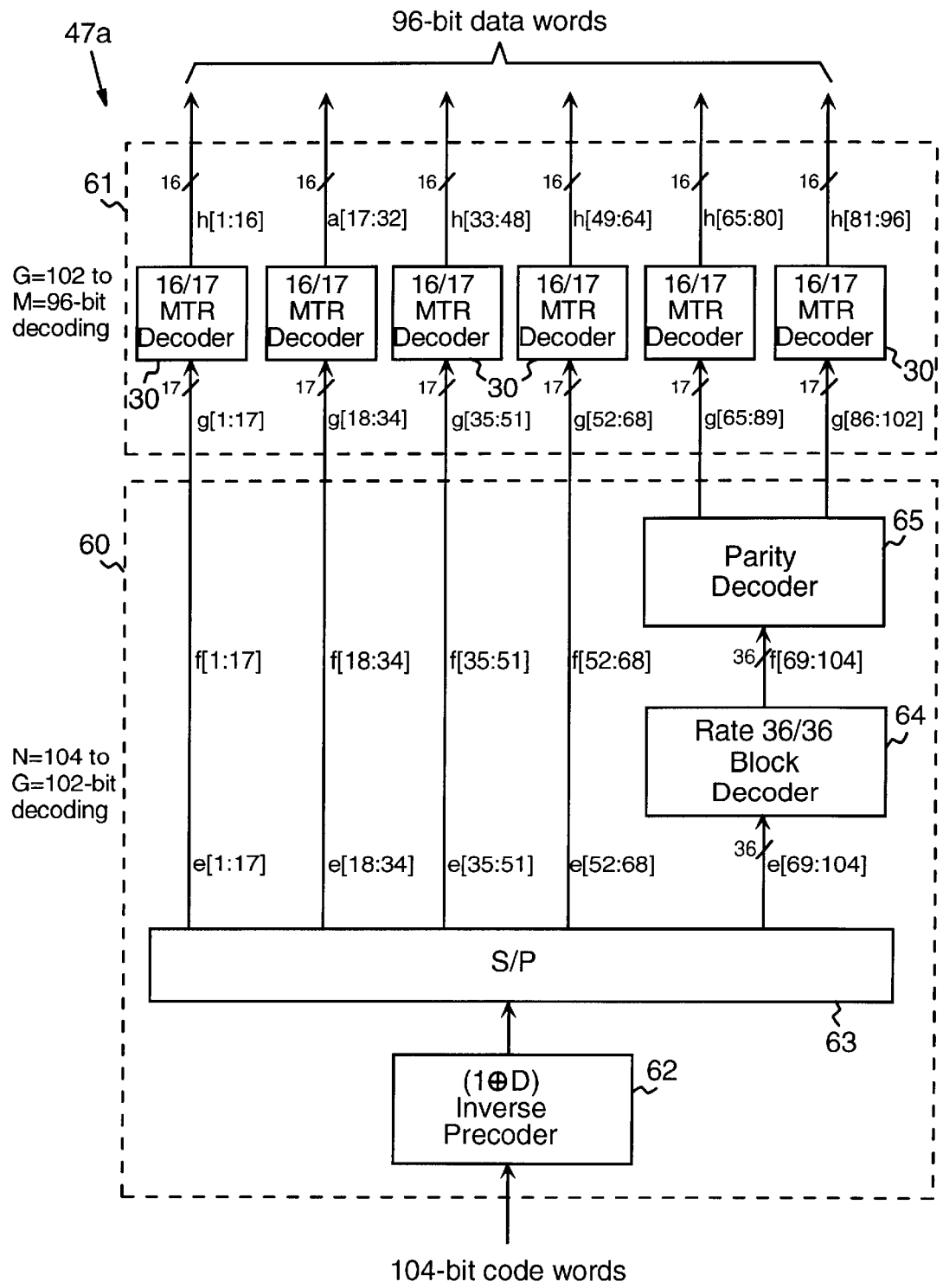
FIG. 9 is a more detailed block diagram of one embodiment of the MTR/parity decoder of the FIG. 7 system.

FIG. 9 illustrates an MTR/parity decoder corresponding to the MTR/parity encoder 40a for use as decoder 47 in the system of FIG. 7. The detailed operation of this decoder will be apparent from the foregoing description of MTR/parity encoder 40a. Briefly, however, the MTR/parity decoder 47a of this embodiment consists of first and second decoders indicated generally at 60 and 61 respectively. The first decoder 60 consists of a (1⊕D) inverse precoder 62, a serial-to-parallel converter (S/P) 63, a rate 36/36 block decoder 64, and a parity decoder 65 connected as shown in the figure. The second decoder 61 consists of six rate 16/17 MTR decoders 30 as described in detail above with reference to FIG. 6. In operation, the stream of 104-bit code words from detector 46 of FIG. 7 is supplied to inverse precoder 62 for (1⊕D) processing, and then converted to parallel form by S/P converter 63 to obtain 104-bit words denoted by e[1:104] in the figure. The block decoding of e[69:104] by block decoder 64 converts e[1:104] to f[1:104] where:

$$f_i = e_i \text{ for } 1 \leq i \leq 78, \text{ and } i=80, 84, 89, \text{ and } 93 \leq i \leq 104, \quad (29)$$

and $$r_1 = e_{84} e_{85} \quad (30)$$

$$r_2 = \bar{e}_{86} e_{87} e_{88} e_{89} \bar{e}_{90} \quad (31)$$

$$r_3 = r_1 \bar{e}_{92} \tag{32}$$

$$t_1 = \bar{e}_{83}\, r_1 e_{86} \bar{e}_{87} \tag{33}$$

$$t_2 = r_2 \bar{r}_3 \tag{34}$$

$$t_3 = r_2 r_3 \tag{35}$$

$$t_4 = t_1 \bar{r}_2 \tag{36}$$

$$t_5 = t_1 + t_3 \tag{37}$$

$$t_6 = t_2 + t_3 \tag{38}$$

$$f_{79} = e_{79} l_{1+} (\bar{e}_{79} \oplus e_{81}) t_1 \tag{39}$$

$$f_{81} = e_{81} + t_1 \tag{40}$$

$$f_{82} = e_{82} + t_5 \tag{41}$$

$$f_{83} = e_{83} + t_5 \tag{42}$$

$$f_{85} = e_{85} l_5 \tag{43}$$

$$f_{86} = e_{86} t_4 + e_{82} t_5 + \bar{e}_{92} t_2 \tag{44}$$

$$f_{87} = e_{87} t_4 + e_{81} t_1 + (e_{91} \oplus e_{92}) t_2 + \bar{e}_{91} t_3 \tag{45}$$

$$f_{88} = e_{88} l_6 \tag{46}$$

$$f_{90} = e_{90} + t_6 \tag{47}$$

$$f_{91} = e_{91} + t_6 \tag{48}$$

$$f_{92} = e_{92} + t_6 \tag{49}$$

The parity decoder 65 then deletes the two parity bits $f_{83}$ and $f_{90}$ to obtain g[1:102] where:

$$g_i = f_i \text{ for } 1 \leq i \leq 82, \tag{50}$$

$$g_i = f_{i+1} \text{ for } 83 \leq i \leq 88, \tag{51}$$

$$g_i = f_{i+2} \text{ for } 89 \leq i \leq 102, \tag{52}$$

Thus, the effect of first decoder 60 is to decode the input (N=104)-bit code word to produce the corresponding (G=102)-bit word. Finally, the MTR decoders 30 of the second decoder 61 decode respective 17-bit blocks of g[1:102] to produce the sixteen-bit blocks h[1:16], . . . , h[81:96] as described above, to recover the original 96-bit data word h[1:96].

Figure 10:
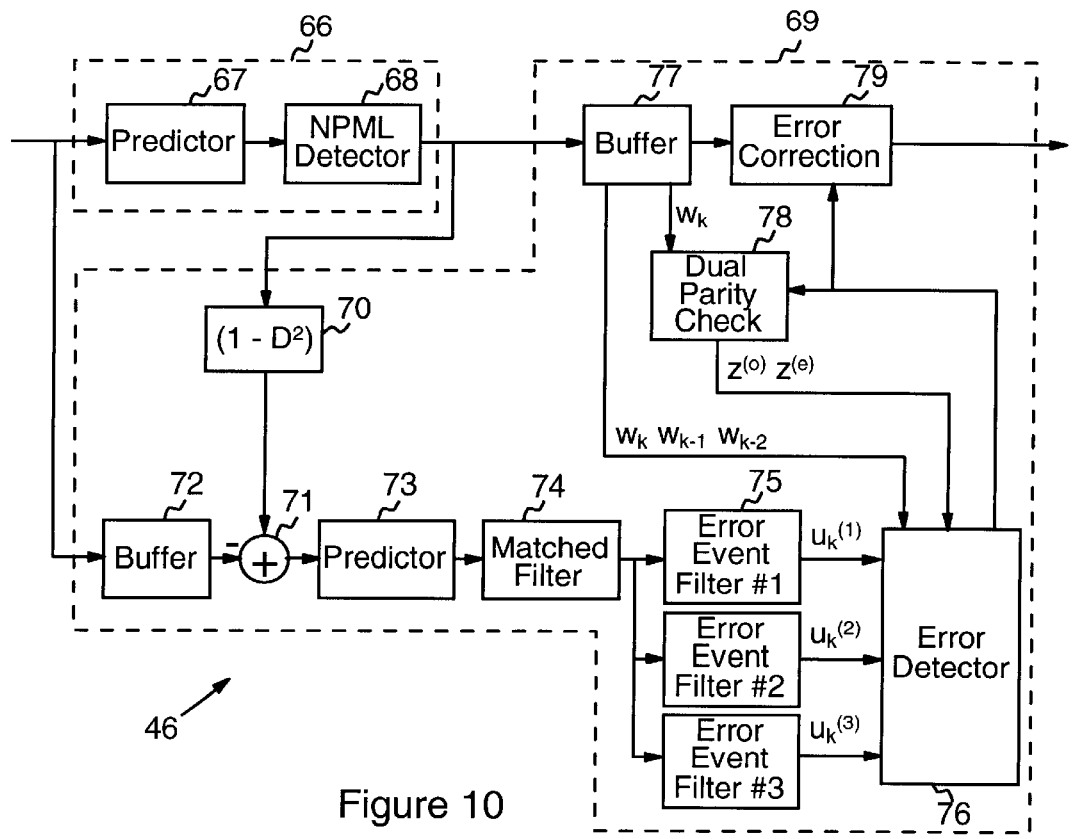
FIG. 10 is a more detailed block diagram of an embodiment of the detector of the FIG. 7 system.

Referring back to FIG. 7, the stream of code words supplied to MTR/parity decoder 47a as just described is generated by detector 46 from the data reproduced from the recording channel. Preferred embodiments of the reproduction processing apparatus 45 employ a particularly simple structure for detector 46. This structure comprises a Viterbi sequence detector which operates on the time varying channel trellis, and a post-processor which identifies and corrects the most likely error events in the sequence detector output in dependence on the parity condition imposed by the MTR/parity encoding process. FIG. 10 illustrates an example of the preferred detector structure, and the operation will be described for the rate 96/104 MTR/parity code discussed above. In this preferred embodiment, the sequence detector, indicated generally at 66, includes an FIR prediction filter (predictor) 67 of the form $(130\, p_1 D + p_2 D^2)$, where the fractional predictor coefficients $\{p_1, p2\}$ depend on the operating point PW50/T (PW50 being the pulse width at the 50% amplitude point of the channel response, and T being the channel bit period). This is followed by a 16-state "fractional target", or noise-predictive maximum likelihood (NPML), detector 68 of generally known form. In particular, the structure and operation of NPML detector 68, and the function of predictor 67, are generally as described in International applications nos. WO 97/11544 and WO 98/52330 referenced above, and need not be described in detail here. In this particular example, however, the 16-state trellis associated with the NPML detector 68 incorporates the following code constraints:

Constraint I: The pattern 1111 can only occur in 16 out of 104 possible positions, namely:
1) At bit positions 103, 104, 1 and 2 (code word boundary)
2) At bit positions 8, 9, 10 and 1.
3) At bit positions 16, 17, 18 and 19
4) At bit positions 25, 26, 27 and 28
5) At bit positions 33, 34, 35 and 36
6) At bit positions 42, 43, 44 and 45
7) At bit positions 50, 51, 52 and 53
8) At bit positions 59, 60, 61 and 62
9) At bit positions 67, 68, 69 and 70
10) At bit positions 76, 77, 78 and 79
11) At bit positions 80, 81, 82 and 83
12) At bit positions 82, 83, 84 and 85
13) At bit positions 85, 86, 87 and 88
14) At bit positions 88, 89, 90 and 91
15) At bit positions 90, 91, 92 and 93
16) At bit positions 95, 96, 97 and 98

Constraint II: The pattern 111 cannot occur in 10 out of 104 possible positions, namely:
1) At bit positions 1, 2, and 3
2) At bit positions 15, 16 and 17
3) At bit positions 18, 19 and 20
4) At bit positions 32, 33 and 34
5) At bit positions 35, 36 and 37
6) At bit positions 49, 50 and 51
7) At bit positions 52, 53 and 54
8) At bit positions 66, 67 and 68
9) At bit positions 69, 70 and 71
10) At bit positions 102, 103 and 104

Constraint I implies that the branch from state 5 (−+−+) to state 10 (+−+−) and the branch from state 10 (+−+−) to state 5 (−+−+) in the 16-state time-varying trellis are eliminated at all times except at the end of the time intervals 2, 11, 19, 28, 36, 45, 53, 62, 70, 79, 83, 85, 88, 91, 93 and 98. Constraint II implies that the states 5 (−+−+) and 10 (+−+−) in the 16-state time-varying trellis are eliminated at the end of the time intervals 3, 17, 20, 34, 37, 51, 54, 68, 71 and 104.

NPML detector 68 thus operates to detect the most-likely N-bit code words corresponding to the reproduced PR4 (partial response class 4) data signal supplied to predictor 67, and to output the stream of estimated code words to the parity post-processor. The noise-predictive parity post-processor of this embodiment is indicated generally at 69 in FIG. 10. This includes a $(1-D^2)$ unit 70 connected between the output of NPML detector 68 and one input of an adder 71, and a buffer 72 which receives the input PR4 signal and supplies this to the subtract-input of adder 73 after a delay corresponding to that introduced by predictor 67, NPML detector 68 and $(1-D^2)$ unit 70. The output of adder 71 is connected to a $(1 + p_1 D + p_2 D^2)$ predictor 73 followed by filter 74 which is matched to the detector target. The output of matched filter 74 is connected to a set of three error event filters 75 the outputs of which are supplied to error detector unit 76. The parity post processor further includes a buffer 77, dual parity check unit 78 and error correction unit 79, connected between the output of NPML detector 68 and the error detection unit 76 as indicated in the figure.

The purpose of the parity post-processor 69 is to detect the type, the polarity and the location of the most likely error event using the parity condition imposed during encoding, and to feed this information to the error correction unit 79 wherein appropriate correction is performed. To this end it will be seen that, in operation, adder 71 serves to extract the error events at the output of the NPML detector 68 by subtracting the (delayed) PR4 signal output by buffer 72 from the partial-response channel input estimates provided by the NPML detector after $(1-D^2)$ processing in unit 70. This error signal is then fed to predictor 73 in the presence of colored noise. The predictor 73 removes the noise correlation by prediction/whitening and passes the signal through filter 74 that is matched to the detector target. The matched filter output is then fed to the bank of error event filters 75. Each of these filters is matched to a particular error event that is likely to occur at the output of the NPML detector. For the range of operating points of interest, and for the MTR/parity code of this example, the most likely error event types at the output of the 16-state NPML detector are +, +−, and +−+. If the polarity of these error events is reversed the error events are −, −+, and −+−. The correlation outputs of the error event filters 75 at time instant k, denoted by $u_k^{(i)}$, $1 \leq i \leq 3$ in the figure, are supplied to error detector unit 76. In unit 76, the filter outputs $u_k^{(i)}$, and the negative filter outputs $-u_k^{(i)}$, $1 \leq i \leq 3$, are normalized by subtracting a normalization constant $C^{(i)}$, $1 \leq i \leq 3$, which depends on the predictor taps $\{p_1, p_2\}$ and the type of the error event i, $1 \leq i \leq 3$, as will be apparent to those skilled in the art.

The subsequent operation of error detector 76, dual parity check unit 78 and error correction unit 79 in detecting and correcting error events will now be explained. In this section, $x_k$, $1 \leq k \leq n$, denotes the bit at time instant k, and the array notation x[1:z] indicates a block of z bits where $x_1$ is the least recent bit and $x_2$ is the most recent bit as before. The estimate of a 104-bit code word at the output of the 16-state NPML detector is denoted by w[1:104]. Two consecutive code words are indicated schematically in FIG. 11. The bits $w_k, w_{k-1}, w_{k-2}$ are supplied by buffer 77 to error detector 76 after a delay corresponding to the processing delay of units 70 to 75, and the bits $w_k$ are similarly supplied to dual parity check unit 78. The dual parity check unit 78 generates the parity bits $z^{(o)}$ and $z^{(e)}$ as a result of a parity check over odd-numbered and even-numbered bits of the array w[1:104] in accordance with the parity condition imposed during the encoding process, i.e.:

$$z^{(o)} = \bigoplus_{i=0}^{51} w_{1+2i},$$

$$z^{(e)} = \bigoplus_{i=0}^{51} w_{2+2i}.$$

The parity bits $z^{(o)}$ and $z^{(e)}$ are then supplied to error detector 76 as indicated. Error detector 76 determines the type, the polarity and the ending time instant of a valid error event with maximum normalized correlation, i.e.:

$$\max_{1 \leq i \leq 3} \left\{ \max_{k \in L_{ij}} \{u_k^{(i)} - C^{(i)}\}, \max_{k \in L_{ij}} \{-u_k^{(i)} - C^{(i)}\} \right\},$$

where i, $1 \leq i \leq 3$, indicates the length of the input error event and j, $1 \leq j \leq 3$, indicates the result of the parity check, i.e.:
   i=1 if input error event is of type +
   i=2 if input error event is of type +−
   i=3 if input error event is of type +−+
and j=1 if $z^{(o)}=0$, and $z^{(e)}=1$
j=2 if $z^{(o)}=1$, and $z^{(e)}=0$
j=3 if $z^{(o)}=1$, and $z^{(e)}=1$ The set of time instants $L_{ij}$ that need to be considered for finding the maximum are: for j=1,
   $L_{11} = \{2,4,6,8, \ldots, 102,104\}$,
   $L_{21} = \{105\}$,
   $L_{31} = \{3,5,7,9, \ldots, 101,103,106\}$,
for j=2,
   $L_{12} = \{1,3,5,7, \ldots, 101,103\}$,
   $L_{22} = \{\ \}$,
   $L_{32} = \{4,6,8,10, \ldots, 102,104\}$,
and for j=3,
   $L_{13} = \{\ \}$,
   $L_{23} = \{2,3,4, \ldots, 102,103,104\}$,
   $L_{33} = \{105\}$.

Figure 11:
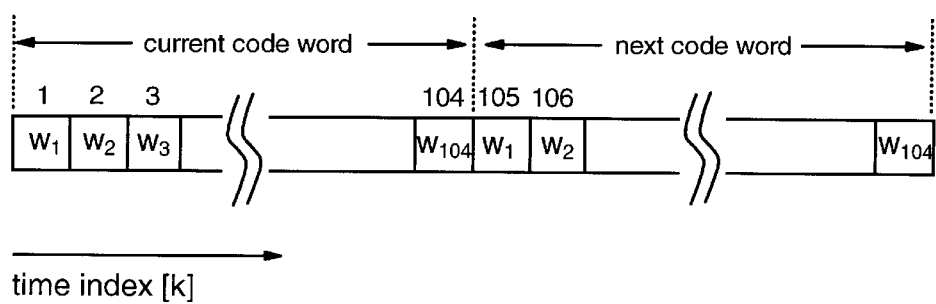
FIG. 11 is a schematic illustration of a pair of consecutive code words produced in the detector of FIG. 10.

The type, polarity and location (ending time instant) of the error event which gives the maximum normalized correlation are thus identified by error detector 76. Subject to two further conditions specified below, the error detector then instructs the error correction unit 79 to correct the identified error event by inverting the appropriate bits of w[1:104] which are forwarded to unit 79 by buffer 77. Note that the time instants 105 and 106 above are time instants beyond the code word boundary as indicated in FIG. 11. Thus, only $w_1$ and/or $w_2$ may be affected by the correction of border error events in the previous block, whereas $w_3, w_4, w_5, \ldots, w_{103}, w_{104}$ are the direct estimates at the output of the 16-state NPML detector 68. Border error events, that extend over two 104-bit blocks, are thus corrected in one shot. When this occurs, the error detector 76 instructs parity check unit 78 to correct $w_1$ and/or $w_2$ as appropriate for the purpose of parity checking over the new block.

As noted above, the error detector 76 only initiates correction of an error event if two conditions are satisfied. These are:
   1) that a parity violation is detected, i.e., $z^{(o)}=1$ and/or $z^{(e)}=1$; and
   2) that the correction of the most likely error event, as selected by the parity post-processor, would not violate the MTR j=3,4 constraints of the rate 96/104 code.

The error detector thus checks for these conditions before providing a control input to error correction unit 79 to instigate error correction. From error correction unit 79, the error corrected code words are output to the MTR/parity decoder as described above.

It will be seen that the use of an MTR/parity encoding system with two parity bits allows accurate detection of the type, polarity and location of the most likely error events for the code of this example using a simple yet efficient detector structure. In general in embodiments of the invention, the use of multiple interleaved parity bits provides for highly robust error correction performance. It will of course be appreciated that, in general, the set of error event filters may comprise one or more filters depending on the number of error events to be detected. For example, an additional filter 75 could be added in the above example to detect error events of the type +00+, and the appropriate adjustments to the process described above in this case will be apparent to those skilled in the art.

While a preferred form of detector 46 has been described above, detector 46 could be implemented by an optimal Viterbi sequence detector that operates on the combined channel and parity-bits trellis. In general, this "super trellis" will be time-varying, reflecting the constraints on the number of consecutive transitions allowed by the MTR coding schemes employed. For a generalized partial response channel characterized by a polynomial of degree four, the current state in the corresponding 16-state fractional-target Viterbi detector 68 is defined by $(a_{n-3}, a_{n-2}, a_{n-1}, a_n)$ where $a_n$ is the current binary symbol and $a_{n-3}, a_{n-2}, a_{n-1}$ are the past three symbols at the input of the generalized partial response channel. If a parity code with two parity bits, as in the above example, is utilized on a generalized partial response channel characterized by a degree-4 polynomial, the optimal detector would combine the 16-state channel trellis and 4-state parity code trellis and would therefore have 64 states. In a particular implementation, the current state of an optimal 64-state detector can be defined by appending two running parity bits to the state of the channel trellis $(a_{n-3}, a_{n-2}, a_{n-1}, a_n)$. In this case the state in the optimal 64-state Viterbi detector is defined by $(a_{n-3}, a_{n-2}, a_{n-1}, a_n, p_n, p_{n-1})$ where $p_n$ is the running parity over the interleave containing $a_n$ and $p_{n-1}$ is the running parity over the interleave containing $a_{n-1}$. Clearly, as the parity condition is satisfied at the block boundaries, the trellis of the optimum 64-state detector is constrained to 16 states at block boundaries. While such a 64-state detector provides optimum performance, in practice there is only a small performance difference with the simplified detector structure of FIG. 10 as will be demonstrated below.

Operation of the data recording system has been described above with reference to an embodiment of the MTR/parity encoding method which implements a rate 96/104 MTR/parity code with j=3/4. However, as noted earlier, this code is only one member of the family of rate (64n+32)/(68n+36) MTR/parity j=3/4 codes, i.e. for the particular case of n=1. The same techniques can be applied to implement all other codes in this family, i.e. for n=0, 2, 3, 4, etc. Considering n=0 for example, a rate 32/36 MTR/parity j=3/4 encoder is obtained using only two rate 16/17 MTR encoders 20 in the MTR/parity encoder 40a of FIG. 8. Specifically, assuming $c_i=0$, $1 \leq i \leq 68$, in the above encoding process, the mapping of the 32 bits a[65:96] to the 36 bits d[69:104] defines the rate 32/36 MTR/parity encoder. Similarly, the mapping of the 36 bits e[69:104] to the 32 bits h[65:96] in FIG. 9 defines the corresponding rate 32/36 MTR/parity decoder. The operation of the NPML detector and parity post-processor in this case will be apparent to those skilled in the art, the code constraints that should be incorporated into the time-varying trellis of the 16-state fractional target detector being readily derivable from the constraints described above for the n=1 case. Similarly, the form and operation of the encoder/decoder system for the n=2, 3, 4, etc. codes in this family will be apparent to those skilled in the art from the foregoing, additional sets of rate 16/17 MTR encoders/decoders 20, 30 being added in the encoding/decoding stages as appropriate.

Figure 12:
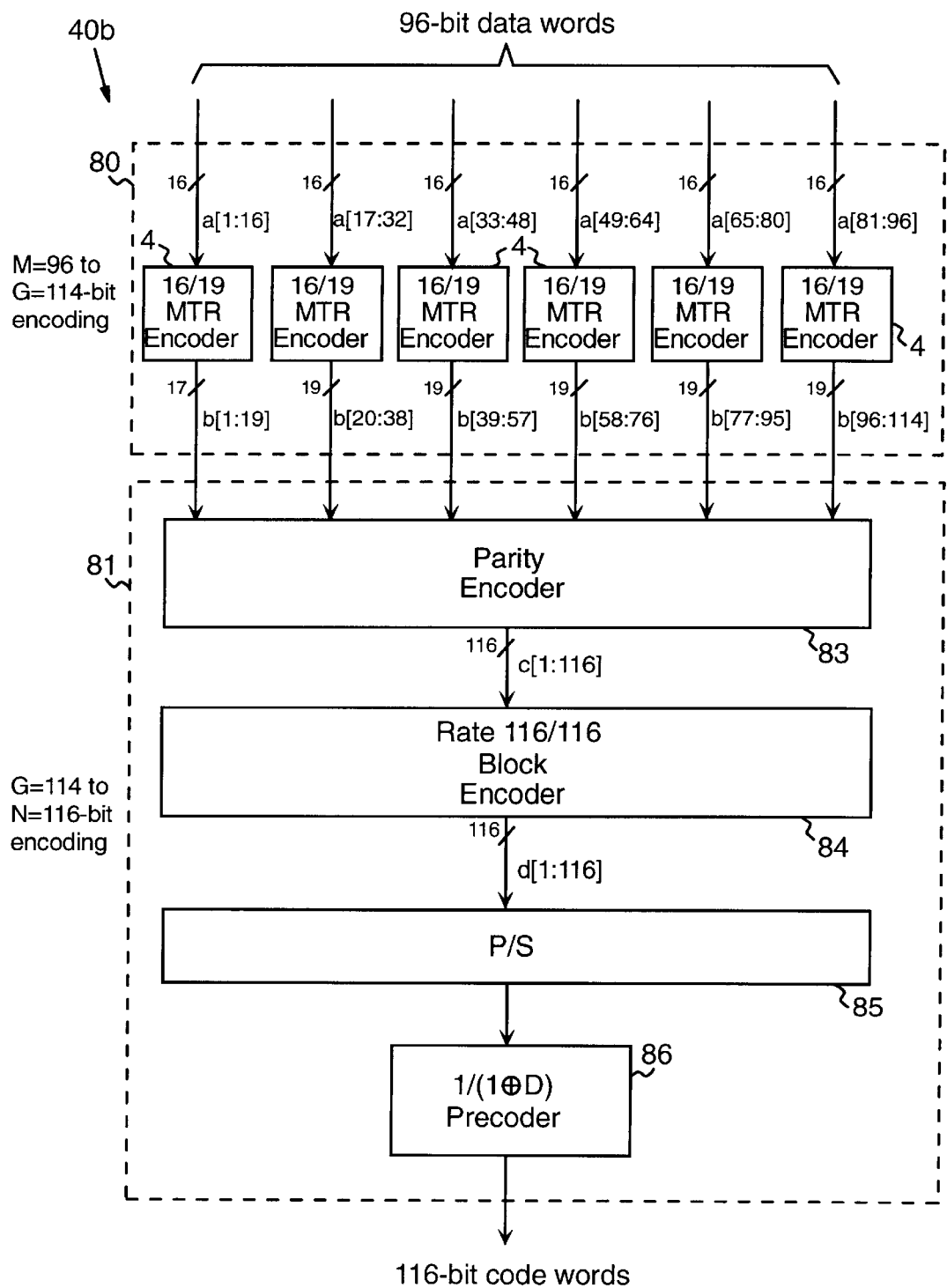
FIG. 12 is a more detailed block diagram of another embodiment of the MTR/parity encoder of the FIG. 7 system.

The second family of MTR/parity encoders and decoders mentioned earlier implement rate M/N MTR j=2 codes where M=(64n+32) and N=(76n+40), and n=1, 2, 3, ..., etc. In this family, the MTR coding scheme employed in the first encoding stage uses the rate 16/19 MTR(2, 9/14) code described with reference to FIG. 2 as the mother code. FIG. 12 illustrates a preferred embodiment of such an MTR/parity encoder for the case where n=1. The MTR/parity encoder 40b in the figure thus implements a rate 96/116 MTR/parity j=2 code. As illustrated, the MTR/parity encoder 40b again consists of a first encoder, indicated generally at 80, and a second encoder, indicated generally at 81. The first encoder 80 consists of six rate 16/19 MTR encoders 4 as described above with reference to FIG. 2. The second encoder consists of a parity encoder 83, a rate 116/116 block encoder 84, a parallel-to-serial converter 85 and a $1/(1 \oplus D)$ precoder 86. The bit arrays at the input and output of the various encoding stages are as indicated in the figure. Thus, the first encoder 80 operates to encode each (M=96)-bit data word a[1:96] in accordance with the MTR coding scheme collectively implemented by MTR encoders 4, to produce the (G=114)-bit word b[1:114]. This satisfies an MTR j=j$_1$ constraint, where j$_1$=2 here, together with the constraints on k and q defined above. The second encoder 81 then implements a second coding scheme to encode b[1:114] into the output (N=116)-bit code word. In more detail, the parity encoder 83 generates two parity bits from the input bit values of b[1:114]. These parity bits are inserted at specific locations to produce the 116-bit parity-coded word c[1:116]. Specifically:

$$c_i = b_i \text{ for } 1 \leq i \leq 19, \quad (53)$$

$$c_i = b_{i-1} \text{ for } 21 \leq i \leq 77, \quad (54)$$

$$c_i = b_{i-2} \text{ for } 79 \leq i \leq 116, \quad (55)$$

and $c_{20}$ and $c_{78}$ are parity bits that are accumulated based on the parity equations $$\bigoplus_{i=0}^{28}(c_{3+4i} \oplus c_{4+4i}) = 0, \quad (56)$$

and $$\bigoplus_{i=0}^{57} c_{2+2i} = 0, \quad (57)$$

respectively.

The rate 116/116 block encoder 84 then further encodes the parity-coded word c[1:116] into d[1:116] to restore an MTR j=2 constraint at the output of MTR/parity encoder 40b while preserving the parity equations as before. The rate 116/116 code implemented by block encoder 84 is defined by the following Boolean equations:

$$d_i = c_i \text{ for } 1 \leq i \leq 18,\ 24 \leq i \leq 74,\ 80 \leq i \leq 116,\text{ and } i=21,77 \quad (58)$$

and $$q_1 = c_{19} c_{20} c_{21} \quad (59)$$

$$q_2 = c_{77} c_{78} c_{79} \quad (60)$$

$$d_{19} = c_{19} \bar{q}_1 + c_{23} q_1 \quad (61)$$

$$d_{20} = c_{20} \bar{q}_1 \quad (62)$$

$$d_{22} = c_{22} \bar{q}_1 + q_1 \quad (63)$$

$$d_{23} = c_{23} \bar{q}_1 \quad (64)$$

$$d_{75} = c_{75} \bar{q}_2 \quad (65)$$

$$d_{76} = c_{76} \bar{q}_2 + q_2 \quad (66)$$

$$d_{78} = c_{78} \bar{q}_2 \quad (67)$$

$$d_{79} = c_{79} \bar{q}_2 + c_{75} q_2 \quad (68)$$

The further coded word d[1:116] is then serialized by P/S converter 85 and fed to the precoder 86 which outputs u[1:116] where, as before:

$$u_i = u_{i-1} \oplus d_i \quad (69)$$

Again, therefore, the overall effect of the coding scheme implemented by second encoder 81 is to perform the parity coding while maintaining an MTR constraint, and to map bits of value "1" in the input (G=114)-bit word (specifically those bits which are unaffected by the block coding) to bit-value transitions in the output (N=116)-bit code word. Thus u[1:116] constitutes the 116-bit code word output by the MTR/parity encoder 40b. The output code word satisfies an MTR $j=j_2$ constraint, where $j_2=j_1=2$, together with a parity condition resulting from the earlier parity coding. The parity condition here is defined by the following two equations:

$$\bigoplus_{i=0}^{57} u_{1+2i} = 0, \quad (70)$$

$$\bigoplus_{i=0}^{57} u_{2+2i} = 0, \quad (71)$$

Thus, the encoding is performed in such a manner that a parity condition has been imposed while preserving an MTR j=2 constraint. (As before, the quantities k and q defined earlier are still constrained in the output code words, though the constraints are less stringent than for the basic rate 16/19 MTR mother code.) The parity condition can be exploited by the detector 46 to identify and correct the most likely error events as before, preferably by a detector incorporating a parity post-processor as described above with reference to FIG. 10. The form and operation of the detector for this code corresponds generally to that described above, with minor variations implicit from the inherent differences between the two codes as will be apparent to those skilled in the art. For example, the set of error event correlation filters 75 will be adjusted in accordance with the different error events for the present code. (In fact, one filter can simply be omitted since the error event +−+ to −+− does not occur for j=2). Similarly, a 14-state NPML detector is sufficient for j=2, states 5 and 10 of the detector trellis for the j=3/4 code above not being possible with the present code.

Figure 13:
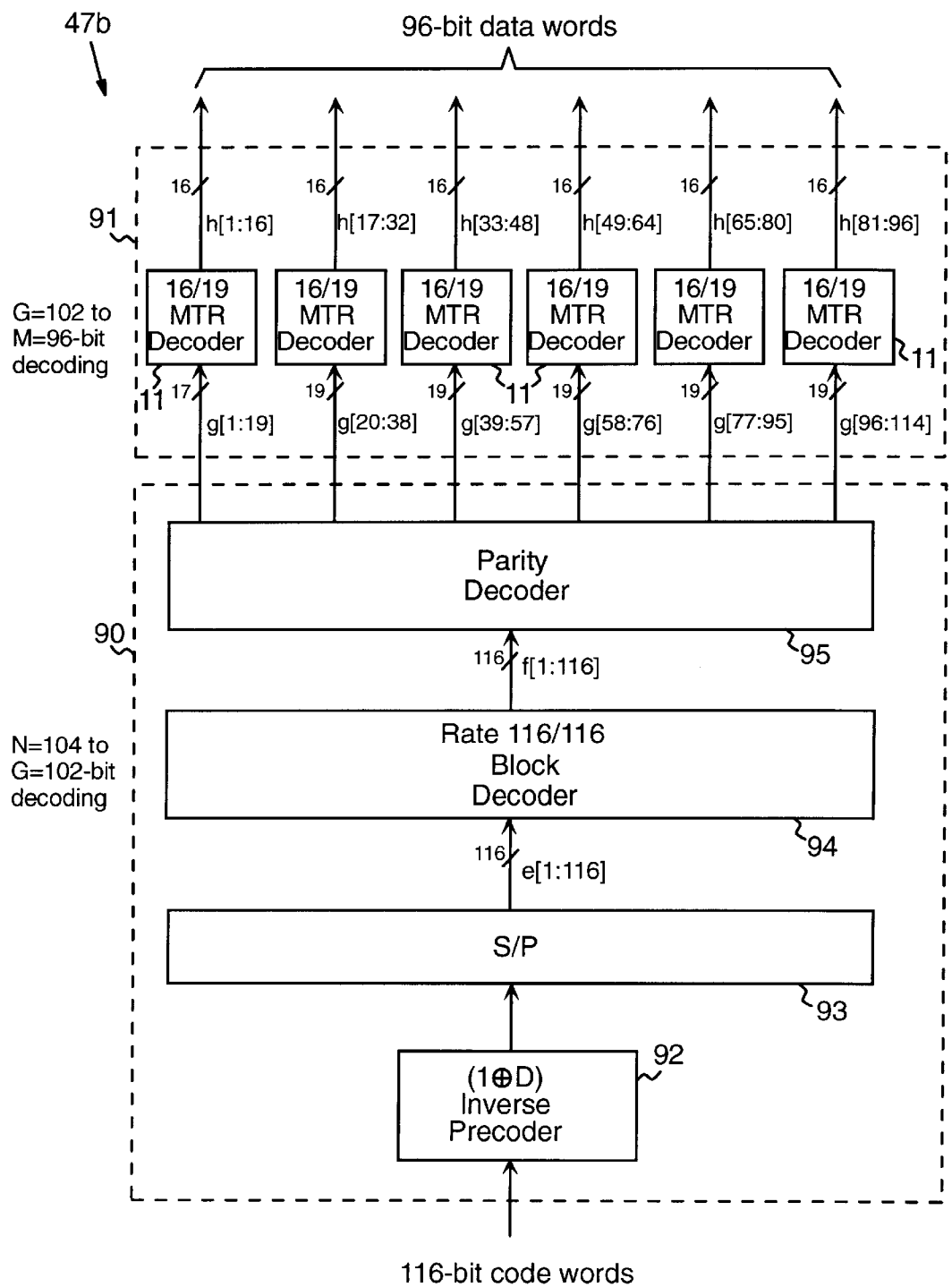
FIG. 13 is a more detailed block diagram of another embodiment of the MTR/parity decoder of the FIG. 7 system.

FIG. 13 illustrates the MTR/parity decoder corresponding to the MTR/parity encoder 40b. As illustrated, the MTR/parity decoder 47b of this embodiment consists of first and second decoders indicated generally at 90 and 91 respectively. The first decoder consists of a (1⊕D) inverse precoder 92, a serial-to-parallel converter 93, a rate 116/116 block decoder 94, and a parity decoder 95 connected as shown. The second decoder 91 consists of six rate 16/19 MTR decoders 11 as described in detail above with reference to FIG. 3. Again, the detailed operation will be apparent to those skilled in the art from the foregoing description of the MTR/parity encoder 40b. Briefly, however, the stream of 116-bit code words from detector 46 of FIG. 7 is supplied to inverse precoder 92 for (1⊕D) processing, and then converted to parallel form by S/P converter 93 to obtain 116-bit words denoted by e[1:116] in the figure. The block decoding of e[1:116] by block decoder 94 converts e[1:116] to f[1:114] where:

$$f_i = e_i \text{ for } 1 \leq i \leq 18,\ 24 \leq i \leq 74,\ 80 \leq i \leq 116,\ \text{and } i=21,77 \quad (72)$$

and $$r_1 = \bar{e}_{20} e_{21} e_{22} \bar{e}_{23} \quad (73)$$

$$r_2 = \bar{e}_{75} e_{76} e_{77} \bar{e}_{78} \quad (74)$$

$$f_{19} = e_{19} \bar{r}_1 + r_1 \quad (75)$$

$$f_{20} = e_{20} \bar{r}_1 + r_1 \quad (76)$$

$$f_{22} = e_{22} \bar{r}_1 \quad (77)$$

$$f_{23} = e_{23} \bar{r}_1 + e_{19} r_1 \quad (78)$$

$$f_{75} = e_{75} \bar{r}_2 + e_{79} r_2 \quad (79)$$

$$f_{76} = e_{76} \bar{r}_2 \quad (80)$$

$$f_{78} = e_{78} \bar{r}_2 + r_2 \quad (81)$$

$$f_{79} = e_{79} \bar{r}_2 + r_2 \quad (82)$$

The parity decoder 95 then deletes the two parity bits $f_{20}$ and $f_{78}$ to obtain g[1:114] where:

$$g_i = f_i \text{ for } 1 \leq i \leq 19, \quad (83)$$

$$g_i = f_{i+1} \text{ for } 20 \leq i \leq 76, \quad (84)$$

$$g_i = f_{i+2} \text{ for } 77 \leq i \leq 114, \quad (85)$$

Thus, the effect of first decoder 90 is to decode the input (N=116)-bit word to produce the corresponding (G=114)-bit word. Finally, the MTR decoders 11 of the second decoder 91 decode respective 19-bit blocks of g[1:114] as described above into the sixteen output blocks h[1:16], ..., h[81:96] to recover the original 96-bit data word h[1:96].

While the second family of rate (64n+32)/(76n+40) MTR/parity systems has been illustrated for the particular case of the n=1 code, the MTR/parity encoder and decoder can be modified to implement the n=2, 3, 4, etc. codes simply by adding additional sets of rate 16/19 MTR encoders 4 in the MTR/parity encoder 40b, and corresponding additional sets of rate 16/19 decoders 11 in the MTR/parity decoder 47b. The corresponding modifications in detector 46 to deal with the increased word-length will be apparent to those skilled in the art from the foregoing.

Figure 14:
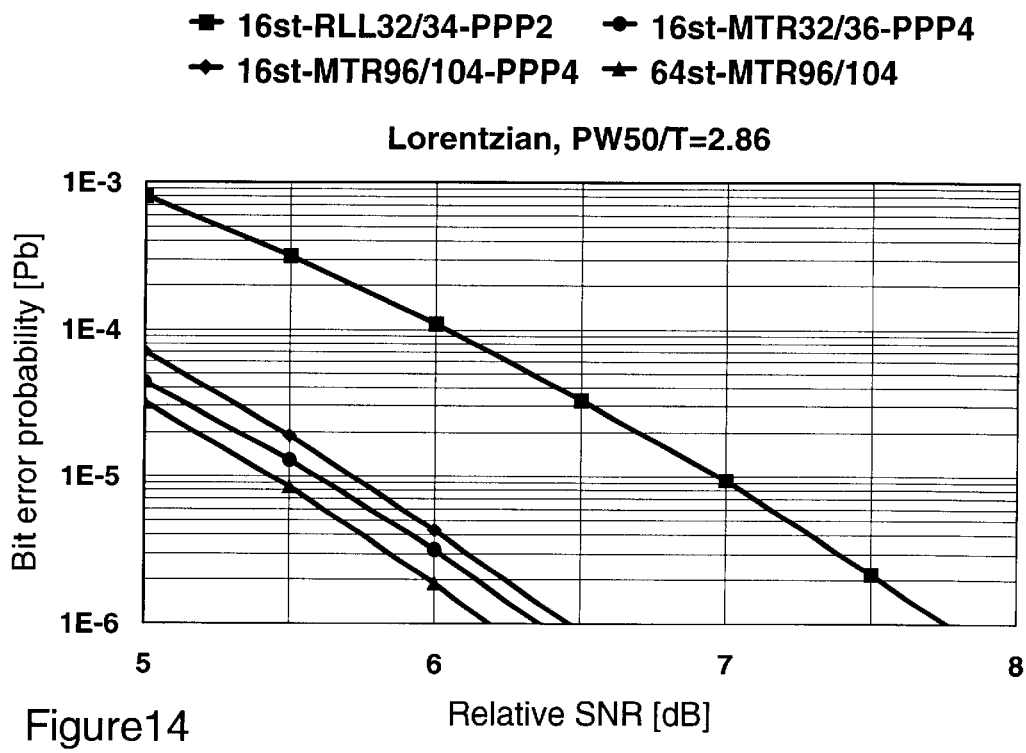
FIG. 14 is a graph illustrating comparative performance of embodiments of the invention for a particular operating point.
Figure 15:
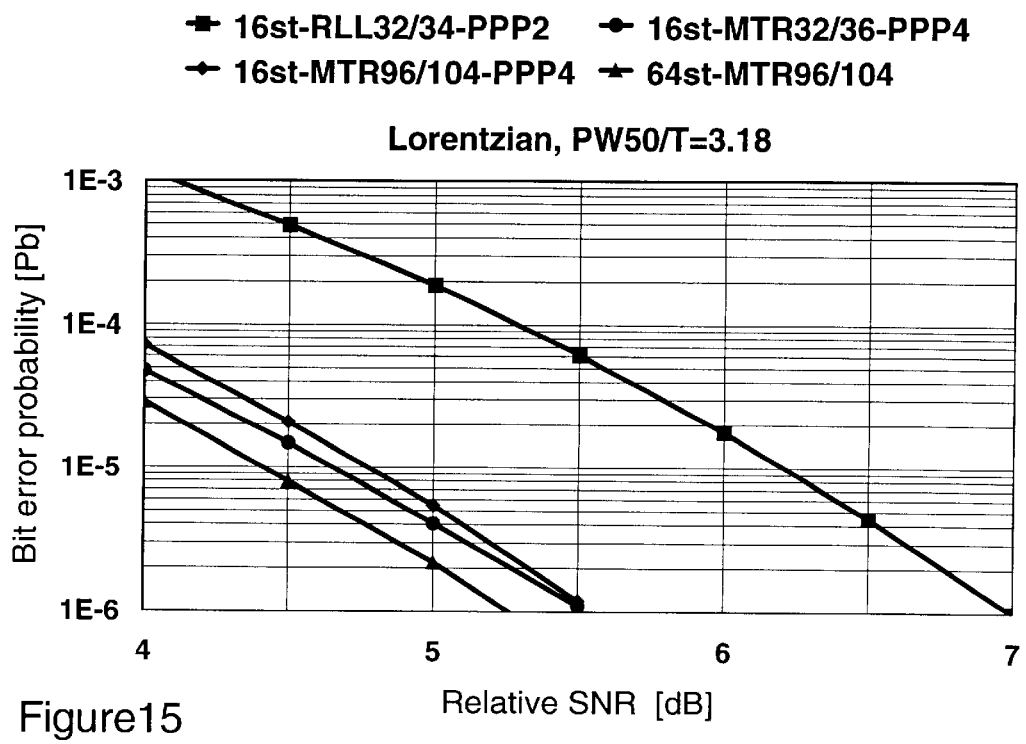
FIG. 15 is a graph illustrating comparative performance of embodiments of the invention for another operating point.

It will be seen from the above that highly efficient, high code rate MTR/parity encoding/decoding systems have been provided. The encoding is performed such that a parity condition is imposed while preserving the MTR j constraint. This parity condition is exploited in the detector to allow correction of the most likely error events, thus providing a substantial improvement in noise margin and subsequently in bit-error rate performance. The use of two parity bits in the above embodiments allows detection of the type, polarity and location of the most likely error events with high accuracy. Overall, MTR/parity codes embodying the invention provide for significant performance gains over both conventional MTR codes and RLL codes with one parity bit as in the July 1998 EEE reference above. By way of illustration, FIGS. 14 and 15 show the bit error probability at the output of the inverse precoder 62 as a function of the relative signal-to-noise ratio (SNR) for the rate 96/104 MTR/parity code and the rate 32/36 MTR/parity code detailed above on a Lorentzian channel at PW50/T=2.86 and PW50/T=3.18. The noise has been modeled by an additive white Gaussian noise source that has been added at the output of the Lorentzian channel. The notation "PPP2" and "PPP4" in these figures indicates that the corresponding parity post-processor (PPP) corrects two and four types of error event respectively. Thus, for the MTR/parity codes, the parity post-processor following the 16-state ("16st") fractional-target detector 68 corrects the four types of error events: +, +−, +−+ and +00+. In this example therefore, an additional error event filter is employed for the +00+ error event as compared with the parity post-processor of FIG. 10. The figures compare the MTR/parity code performance with an RLL32/34 code with one parity bit, the performance of which is equivalent to that disclosed in the July 1998 IEEE reference above. As illustrated by these figures, the SNR gain over the RLL plus one parity bit code is 1.3 dB and 1.45 dB at PW50/T=2.86 and PW50/T=3.18 respectively. It will also be seen from these figures that the performance of the 16-state fractional target detector followed by the parity post-processor is only 0.3 dB worse than the performance of an optimal combined channel/parity 64-state detector as discussed above.

Boolean Logic Design for the Rate 16/19 MTR Encoder 4 and Rate 16/19 MTR Decoder 11

This section specifies a highly efficient Boolean implementation for the encoder 4 and decoder 11 of the rate 16/19 MTR(2, 9/14) code discussed above. The encoder and the decoder can be implemented with a total of 369 binary-input logic gates. In the following, the operations ~, & and | stand for the Boolean operations NOT, AND and OR, respectively. (Note that here, and in the following section, different notation is used compared with the Boolean equations given earlier in this text). In the encoder logic, x(1) to x(16) represent the sixteen bits supplied to the sixteen bit-lines of the MTR encoder input (i.e. 5a, 6a and 7a) from left to right in FIG. 2; k1 represents the 1-bit of input 6c; and y(1) to y(19) represent the nineteen bits of the MTR encoder output from left to right in the figure. In the decoder logic, y(1) to y(19) represent the nineteen bits of the input word from left to right in FIG. 3; yy(1) to yy(19) represent the nineteen bits of the inputs to decoders 14 to 16 from left to right in the figure; and z(1) to z(16) represent the sixteen bits of the MTR decoder output, again from left to right.

MTR Encoder Logic:

m11=x(2)|x(3)
m21=x(5)|x(6)
m31=x(1)&x(2)
m41=x(2)&x(3)
m51=x(5)&x(6)
m61=x(4)&m51
m71=x(1)|m11
m81=x(1)|x(4)
p1=~m31&~m61&(m81|((m11|x(5))&(m41&m51)))
q1=m31&(~x(4)|(x(3)&~x(5)))
r1=~m31 &m61
s1=~p1&~m81
t1=~q1&m31
a1=p1&m51
b1=(m31&m51)|(m41&m61)
c1=(~(x(4)|m21))|(r1&~m71)|(t1&~m21)
k1=x(6)&(~r1|x(3))
m12=x(8)|x(9)
m22=x(11)|x(12)
m32=x(7)&x(8)
m42=x(8)&x(9)
m52=x(11)&x(12)
m62=x(10)&m52
m72=x(7)|m12
m82=x(7)|x(10)
m92=x(10)&x(11)&~x(12)
u12=k1&x(7)&~x(8)&x(9)&m92
u22=~k1&~m72&m92
p2=~m32&~m62&(m82|((m12|m22)&~(m42&m52)))
q2=m32&(~x(10)|(x(9)&~x(11)))
r2=~m32&m62
s2=~p2&~m82
t2=~q2&m32
a2=(p2&m52)|u12
b2=(m32&m52)|(m42&m62)
c2=(p2&~(x(10)|x(11)|x(12)))
d2=((p2|q2)&x(7)&~x(9))|(s2&x(9))
e2=(p2&x(7)&x(9)&~u12)|(t2&~x(9))
f2=(p2&~m72&~m92)|(q2&x(9))
m13=x(13)&x(14)
m23=x(15)&x(16)
m33=x(13)|x(14)
m43=x(15)|x(16)
m53=m33|m43
p3=~m13&~m23&m53
q3=m13&~m23
r3=~m13&m23
s3=(m13&m23)|~m53
d3=p3&x(13)
e3=r3
f3=(p3&~m33)
ff3=q3&x(15)
v1=(a1|b1)&d2
v2=a1&e2
v3=b1&e2
v4=c1&f2
v5=(a2|b2)&d3
v6=(a2|b2)&e3
v7=a2&ff3
v8=c2&f3
v9=v2|v3
v10=v1|v9
v11=v4|v10
v12=v7|v8
v13=v6|v7
v14=v5|v6|v12
g1=p1|q1
h1=t1|g1
g2=p2|q2
h2=t2|g2
g3=p3|q3
y(1)=(x(1)&p1)|(~x(3)&(q1|t1))|(x(3)&s1)
y(2)=(x(2)&p1)|r1
y(3)=(x(3)&p1)|(~x(3)&s1)|t1
y(4)=p1&~v3
y(5)=(x(4)&g1)|(x(1)&r1)|(x(3)&s1)|v9
y(6)=((x(5)&h1)|(x(2)&r1))&~v2
y(7)=((x(6)&h1)|(x(3)&r1)|(x(6)&s1))&v10
y(8)=(((x(7)&p2)|(~x(9)&(q2|t2))|(x(9)&s2)|u22)&~u12)|v11
y(9)=(x(8)&p2)|r2|u12|v11
y(10)=((x(9)&p2)|(~x(9)&s2)|t2)&~v11
y(11)=~p2|u22
y(12)=(((x(10)&g2)|(x(7)&r2)|(x(9)&s2))&~u12)|v12
y(13)=((((x(11)&h2)|(x(8)&r2))&~u22)&~v13)|v8
y(14)=((x(12)&h2)|(x(9)&(r2|s2))|u12)&~v14
y(15)=(x(13)&p3)|r3|v12
y(16)=(x(14)&p3)|s3|v14
y(17)=p3&~v14 y(18)=(x(15)&g3)|(x(13)&r3)
y(19)=(x(16)&g3)|(x(14)&r3)|(x(13)&s3)

MTR Decoder Logic:

m14=~(y(6)|y(7))
m24=y(6)&~y(7)
a4=y(5)&m14
b4=y(5)&m24
c4=~y(5)&m14
d4=~y(5)&m24
m15=~(y(13)|y(14))
m25=y(13)&~y(14)
a5=y(12)&m15
b5=y(12)&m25
c5=~y(12)&m15
d5=~y(12)&m25
e5=y(8)&y(9)
e6=y(15)&y(16)
v1=a4&e5
v2=b4&e5
v3=c4&e5
v4=d4&e5
v5=a5&e6
v6=b5&e6
v7=c5&e6
v8=d5&e6
v9=v1|v2
v10=v5|v6
v11=v5|v7
yy(1)=y(1)
yy(2)=y(2)
yy(3)=y(3)
yy(4)=y(4)|v2
yy(5)=y(5)&~v9
yy(6)=y(6)|v1
yy(7)=y(7)|v9|v4
yy(8)=y(8)&~v3
yy(9)=y(9)&~(v9|v3|v4)
yy(10)=y(10)|v9
yy(11)=y(11)
yy(12)=y(12)&~v10
yy(13)=(y(13)|v11)&~v6
yy(14)=y(14)|v11|v8
yy(15)=y(15)&~v10
yy(16)=y(16)&~(v10 |v7|v8)
yy(17)=y(17)|v11
yy(18)=y(18)
yy(19)=Y(19)
m34=yy(1)|yy(6)
p4=yy(4)
q4=yy(4)&~(yy(2)|yy(3))&(~yy(1)|(yy(1)&~yy(5)))
r4=yy(4)&yy(2)
s4=yy(4)&((~m34&yy(3))|(yy(1)&yy(5)))
t4=yy(4)&yy(3)&m34
m35=yy(8)|yy(13)
p5=~yy(11)
q5=yy(11)&~(yy(9)|yy(10))&(~yy(8)|(yy(8)&~yy(12)))
r5=yy(11)&yy(9)
s5=yy(11)&((~m35&yy(10))|(yy(8)&yy(12)))
t5=yy(11)&yy(10)&m35
u15=~yy(8)&yy(9)&yy(10)&~yy(11)&~yy(12)&yy(13)&yy(14)
u25=yy(8)&~yy(9)&~yy(10)&yy(11)&yy(12)&~yy(13)&~yy(14)
m16=~yy(16)&yy(17)
m26=yy(16)&yy(17)
p6=~yy(17)
q6=~yy(15)&m16
r6=yy(15)&m16
s6=m26
g4=q4|t4
g5=q5|t5
h4=p4|g4
h5=p5|g5
i4=s4&yy(1)
i5=s5&yy(8)
g6=(s6&yy(19))
h6=q6|p6
i6=q6|g6
z(1)=(yy(1)&p4)|g4|(yy(5)&r4)
z(2)=(yy(2)&p4)|g4|(yy(6)&r4)|i4
z(3)=(yy(3)&p4)|(~yy(1)&g4)|(yy(7)&r4)|i4
z(4)=(yy(5)&(p4|q4))|r4|t4
z(5)=(yy(6)&h4)|r4|i4
z(6)=(yy(7)&h4)|r4|(s4&yy(7))
z(7)=(yy(8)&p5)|g5|(yy(12)&r5)|u15
z(8)=((yy(9)&p5)|g5|(yy(13)&r5)|i5)&~u15&~u25
z(9)=((yy(10)&p5)|(~yy(8)&g5)|(yy(14)&r5)|i5)&~u25
z(10)=(yy(12)&(p5|q5))|r5|t5|u15|u25
z(11)=(yy(13)&h5)|r5|i5
z(12)=((yy(14)&h5)|r5|i5)&~u15&~u25
z(13)=(yy(15)&p6)|(yy(18)&r6)|i6
z(14)=(yy(16)&p6)|(yy(19)&r6)|i6
z(15)=(yy(18)&h6)|r6|g6
z(16)=(yy(19)&h6)|r6|g6

Boolean Logic Design for the Rate 16/17 MTR Encoder 20 and Rate 16/17 MTR Decoder 30

This section specifies a highly efficient Boolean implementation for the encoder 20 and decoder 30 of the rate 16/17 MTR(3/4(2), 14/22) code discussed above. The encoder and the decoder can be implemented with a total of 713 binary-input logic gates. Again, the operations ~, & and | stand for the Boolean operations NOT, AND and OR, respectively. In the encoder logic, x(1) to x(16) represent the sixteen bits supplied to the sixteen bit-lines of the MTR encoder input (i.e. 22, 21*a* and 23) from left to right in FIG. 5; a1 to a17 represent the seventeen bits of the output 25*b* of the first substitution unit from left to right in the figure; and y(1) to y(17) represent the seventeen bits of the MTR encoder output 28*b*, again from left to right. In the decoder logic, y(1) to y(17) represent the seventeen bits of the input word from left to right in FIG. 6; d1 to d17 represent the seventeen bits of the output 31*b* of the third inverse substitution unit from left to right; e1 to e17 represent the seventeen bits of the input to the first inverse substitution unit 34 from left to right; f1 to f17 represent the seventeen bits of the output of the first inverse substitution unit 34 from left to right; and z(1) to z(16) represent the sixteen bits of the MTR decoder output, again from left to right.

MTR Encoder Logic:

m01=x(5)&x(6)
m11=x(11)&x(12)
m21=m01&m11
m31=x(7)&x(8)
m41=x(9)&x(10)
m51=x(8)&x(9)&(x(7)|x(10))
m61=m21&m31
m71=m21&~m31
m81=x(2)&x(3)
m91=x(14)&x(15)
p1=~m01&~m11
p2=m11&~x(6)&m51
p3=m11&~x(5)&x(6)&(m51|m31)
p4=m11&~m01&~p2&~p3
p5=m01&~x(11)&m51
p6=m01&~x(12)&x(11)&(m51|m41)
p7=m01&~m11&~p5&~p6
p8=m71&~m41
p9=m71&m41
p10=m61&~m41
p11=m61&m41
p12=p11&x(4)
p13=p11&~x(4)
m12=p11|p4
m22=p2|p3
m32=p2|p5
m42=p3|p7
m52=m12|p8
m62=m52|p6
m72=p9|p10
m82=~p11|p13
m92=~p11|p12
a1=m82&x(1)
a2=(m82&x(2))|p12
a3=(m82&x(3))|p12
a4=(~p11&x(4))|(p13&x(13))
a5=(m12&x(5))|m22|(p7&x(12))|(p9&x(7))|(p10&x(10))|p12|(p13&x(14)&~(x(15)&x(16)))
a6=(m12&x(6))|(p7&x(11))|p8|(p9&x(8))|(p10&x(9))|p12|(p13&x(15)&~x(14))
a7=(m62&x(7))|(m32&~x(7))|(m42&x(10))|(p13&m91)
a8=(m62&x(8))|(m32&~x(10))|(m42&x(9))|m72|p12|(p13&x(16)&~m91)
9=~p1
a10=(m52&x(9))|(p2&x(5))|(p7&x(8))|(p5&x(12))|m72|(p12))|m72|(p12&x(1)&~m81|p13
a11=(m52&x(10))|(p2&~x(5))|(p3&~x(7))|(p7&x(7))|(p5&~x(12))|(p6&~x(10))|m72|(p12&m81)
a12=(p1&x(11))|m22|p5|p6|p8|(p12&x(2)&~x(3))|p13
a13=(p1&x(12))|p4|p9|(p12&x(3)&~(x(1)&x(2)))|p13
a14=m92&x(13)
a15=(m92&x(14))|p13
a16=(m92&x(15))|p13
a17=m92&x(16)
m03=a2&a3
m13=m03&a1
m23=m03&a4
m33=m13&a4
m43=a16&a15
m53=m43&a17
m63=m43&a14
m73=m53&a14
m83=a6&a7
m93=a11&a12
v1=m33&a5
v2=m33&~a5&~m83
v3=m33&~a5&m83
v4=m13&~a4
v5=~a1&m23&a5
v6=(a2|a3|a4|a5|a6|a7|a8)
v7=(a16|a15|a14|a13|a12|a11|a10)
v8=~(a1|v6)
v9=m73&a13
v10=m73&~a13&~m93
v11=m73&~a13&m93
v12=m53&~a14
v13=~a17&m63&a13
v14=~(a17|v7)
v15=(v3|v5|v8)
v6=~(v1|v2|v15|v4)
v17=(v11|v13|v14)
v18=~(v9|v10|v17|v12)
v19=a1&~v6&~a9&~v7&a17
v20=~v16|v19
b1=(v16&a1)|v1|(v2&a6)|(v3&a8)|(v4&a5)|(v5&a7)
b2=(v16&a2)|v1|(v2&a7)|(v4&a6)|(v5&a8)|v8|v19
b3=(v16&a3)|v3|(v4&a7)|v8
b4=(v16&a4)|(v1&a7)|v2|v19
b5=(v16&a5)|v20
b6=(v16&a6)|v20
b7=(v16&a7)|v15
b8=(~v15&a8)|v19
b9=a9|v19
b10=(~v17&a10)|v19
b11=(v18&a11)|v17
b12=(v18&a12)|~v18
b13=(v18&a13)|~v18
b14=(v18&a14)|(v9&a11)|v10
b15=(v18&a15)|v11|(v12&a11)|v14
b16=(v18&a16)|v9|(v10&a11)|(v12&a12)|(v13&a10)|v14
b17=(v18&a17)|v9|(v10&a12)|(v11&a10)|(v12&a13)|(v13&a11)
v21=b6&~b7&~b8&b9&b10&~b11&~b12
v22=b6&~b7&b8&b9&~b10&~b11&b12
v23=~b6&b7&b8&~b9&~b10&b11&~b12
v24=b6&b7&~b8&~b9&b10&b11&~b12
v25=b1&b2&~b3&~b4&b5&v21
v26=b1&~b2&~b3&b4&b5&v22
v27=~b1&~b2&b3&b4&~b5&v23
v28=~b1&b2&b3&~b4&~b5&v24
v29=b17&b16&~b15&~b14&~b13&v22&~v26
v30=b17&~b16&~b15&b14&b13&v21&~v25 v31=~b17&~b16&b15&b14&~b13&v24&~v28
v32=~b17&b16&b15&~b14&~b13&v23&~v27
v33=v25|v26|v27|v28
v34=v29|v30|v31|v32
y(1)=b1|v33
y(2)=b2&~v33
y(3)=b3|v33
y(4)=b4&~v33
y(5)=b5|v33
y(6)=(b6|v33)&~v31
y(7)=b7|v33
y(8)=b8&~v33
y(9)=b9|v33|v34
y(10)=b10&~v34
y(11)=b11|v34
y(12)=(b12|v34)&~v27
y(13)=b13|v34
y(14)=b14&~v34
y(15)=b15|v34
y(16)=b16&~v34
y(17)=b17|v34
MTR Decoder Logic:
m04=y(5)&y(6)
m14=m04&y(7)&y(9)
m24=y(1)&y(2)
m34=y(1)&y(3)&m14
u01=m34&~y(10)&~y(11)&y(12)
u11=m34&~y(10)&y(11)&~y(12)
u21=m34&y(10)&~y(11)&~y(12)
u31=m34&y(10)&y(11)&~y(12)
u41=m24&y(4)&m04&y(8)&y(9)&y(10)
u51=u11|u31
u61=u01|u11
u71=u0|u21
u81=u71|u41
u91=u51|u71
m44=y(9)&y(11)&y(12)&y(13)
m54=y(17)&y(15)&m44
m64=m54&~u91
u02=m64&~y(8)&~y(7)&y(6)
u12=m64&~y(8)&y(7)&~y(6)
u22=m64&y(8)&~y(7)&~y(6)
u32=m64&y(8)&y(7)&~y(6)
u42=u12|u32
u52=u02|u12
u62=u02|u22
d1=y(1)&~u51
d2=(y(2)|u21|u31)&~u41
d3=y(3)&~u81
d4=(y(4)|u61)&~u41
d5=y(5)&~u51&~u41
d6=(y(6)|u12)&~u61&|u41
d7=y(7)&~u81
d8=(y(8)|u61)&~u41
d9=y(9)&~u51&~u41&~u42
d10=(y(10)|u52)&~u41
d11=y(11)&~u62 d12=(y12)|u11)&~u52
d13=y(13)&~u42
d14=y(14)|u52
d15=y(15)&~u62
d16=y(16)|u22|u32
d17=y(17)&~u42
m05=d1&d2
m15=d5&d6
m25=~(d1&d2)
m35=m15&d7
m45=m15&~d7
m55=d17&d16
m65=d13&d12
m75=~(d17&d16)
m85=m65&d11
m95=m65&~d11
u03=m05&m45
u13=m25&d4&m15
u23=~d2&d3&m35
u33=m25&~d4&m45&~(~d1&d2&d3&d8&d9)
u43=~d3&m35
u53=d2&d3&m35
u63=u13|u23
u73=u03|u43
u83=u63|u33
u93=u83|u73|u53
u04=m55&m95
u14=m75&d14&m65
u24=~d16&d15&m85
u34=m75&~d14&m95&~(d17&d16&d15&d10&d9)
u44=d15&m85
u54=d16&d15&m85
u64=u14|u24
u74=u04|u44
u84=u64|u34
u94=u84|u74|u54
e1=(d1&~u93)|u83|u03
e2=(d2|u93)&~u53
e3=(d3|u93)&~u53
e4=(d4&~u93)|u63|u73
e5=(d5&~u93)|u73|(u33&d1)
e6=(d6&~u93)|u23|(u13&d1)|(u33&d2)
e7=(d7&~u93)|(u03&d4)|(u13&d2)|u23|(u33&d3)|(u43&d1)
e8=(d8&~u23&~u43)|(u23&d1)|(u43&d2)
e9=d9
e10=(d10&~u24&~u44)|(u24&d17)|(u44&d16)
e11=(d11&~u94)|(u04&d14)|(u14&d16)|u24|(u34&d15)|(u44&d17)
e12=(d12&~u94)|u24|(u14&d17)|(u34&d16)
e13=(d13&~u94)|u74|(u34&d17)
e14=(d14&~u94)|u64|u74
e15=(d15|u94)&~u54
e16=(d16|u94)&~u54
e17=(d17&~u94)|u84|u04
m06=~e10&e11&~e13
m16=~e8&e7&~e5 u05=e2&e3&e5&e6&e8&e9
u15=e16&e15&e13&e12&e10&e9
u25=u05|u15
f1=(e1&~u05)|(u05&(e10|m06))
f2=(e2&~u05)|(u05&(e11|e12))
f3=(e3&~u05)|(u05&(e13|m06))
f4=(e4|u05)&~u15
f5=e5|u25
f6=e6|u25
f7=e7|u25
f8=e8|u25
f9=e9&~u25
f10=e10|u25
f11=e11|u25
f12=e12|u25
f13=e13|u25
f14=(e14&~u15)|(u15&e4)
f15=(e15&~u15)|(u15&(e5|m16))
f16=(e16&~u15)|(u15&(e7|e6))
f17=(e17&~u15)|(u15&(e8|m16))
m07=f11&f10&f8&~f7
m17=f9&f13
mn27=f9&~f13
m37=f9&f12
m47=(f11|f10)&~f6&~(f7&f8)
m57=m37&~f5
m67=m37&f5
q1=m17&m07
q2=m27&m07
q3=m37&f6
q4=m17&~q1
q5=m27&~f12&~q2
q6=m57&m47
q7=m67&m47
q8=m57&~f6&~q6
q9=m67&~q7
q10=q1|q2|q3
q11=q10|q4|q7|q9
q12=q5|q6|q8|q10
q13=q5|q9
q14=q6|q7
q15=f9|q4
q16=~f9|q3|q4
q17=q16|q8
z(1)=f1
z(2)=f2
z(3)=f3
z(4)=f4
z(5)=(q15&f5)|q12|(q7&f10)
z(6)=(q15&f6)|q12|q9
z(7)=(q17&f7)|(q1&f5)|q2|(q5&f11)|(q14&~f7)|(q9&~f11)
z(8)=(q17&f8)|(q1&f6)|q2|(q5&f10)|q14|q9
z(9)=(q16&f10)|q1|(q2&f6)|(q13&f8)|q14|q8
z(10)=(q16&f11)|q1|(q2&f5)|(q13&f7)|(q14&~f8)|(q8&~f11)
z(11)=(~f9&f12)|q11|(q5&f6)|q8
z(12)=(~f9&f13)|q11|(q5&f5)|(q6&f10)
z(13)=f14
z(14)=f15
z(15)=f16
z(16)=f17

While particular preferred embodiments of the invention have been described in detail above, it will be understood that many changes and variations can be made to these embodiments within the spirit and scope of the invention.

We claim:

1. A method for encoding a succession of M-bit data words to produce a succession of N-bit code words, where N>M, for supply to a magnetic recording channel, the method comprising the steps of:

encoding each M-bit data word in accordance with an MTR coding scheme to produce a G-bit word, where N>G>M, such that the maximum number of consecutive bits of a first value in a succession of said G-bit words is limited to a first predetermined value $j_1$; and encoding said G-bit word to produce a said N-bit word in accordance with a second coding scheme wherein at least one parity bit, dependent on the bit-values of said G-bit word, is generated, such that the N-bit word satisfies a predetermined parity condition, and wherein bits of said first value in the G-bit word are mapped to respective bits of the N-bit word which are each of different value to the immediately preceding bit in the N-bit word;

wherein the second coding scheme is such that, in a succession of said N-bit words, the maximum number of consecutive bits which are each of different value to the immediately preceding bit is limited to a second predetermined value $j_2$.

2. A method according to claim 1 wherein the step of encoding said G-bit word comprises generating a plurality of parity bits.

3. A method according to claim 1 wherein said bits of a first value are bits of value "1".

4. A method according to claim 1 wherein the step of encoding said G-bit word includes a 1/(1⊕D) coding step for mapping bits of said first value in the G-bit word to said respective bits of the N-bit word.

5. A method according to claim 1 wherein the step of encoding said G-bit word includes generating said at least one parity bit to produce a parity-coded word, and encoding said parity-coded word in accordance with a further coding scheme to eliminate at least some occurrences of the maximum number of consecutive bit-value transitions in the set of possible N-bit words, said further coding scheme being such that $j_2=j_1$.

6. A method according to claim 1 wherein the step of encoding said G-bit word comprises:

inserting said at least one parity bit in said G-bit word to produce a parity-coded word;

encoding said parity-coded word in accordance with a further coding scheme to eliminate at least some occurrences of the maximum number of consecutive bit-value transitions in the set of possible N-bit words and generate a further-coded word such that $j_2=j_1$; and 1/(1⊕D) coding said further-coded word to produce said N-bit word.

7. A method according to claim 6 wherein said further coding scheme comprises a rate X/X block code where X≦N.

8. A method according to claim 1 wherein the step of encoding each M-bit data word comprises partitioning the M-bit data word into a plurality of m-bit blocks and encoding each m-bit block in accordance with a rate m/g MTR code to produce a g-bit block, whereby the resulting plurality of g-bit blocks produced from the M-bit data word collectively constitute said G-bit word.

9. A method according to claim 8 wherein M=(64n+32) where n≧1, wherein m=16 and g=19, and wherein the step of encoding each 16-bit block to produce a 19-bit block comprises:

partitioning the 16-bit block into first, second and third blocks of six, six and four bits respectively;

encoding the first block in accordance with a rate 6/7 block code to produce a first subcode word, encoding the second block in accordance with a rate 6/7 two-state code to produce a second subcode word wherein the last bit of said first subcode word determines the state for said two-state code, and encoding the third block in accordance with a rate 4/5 block code to produce a third subcode word, whereby said first, second and third subcode words collectively constitute a 19-bit sequence; and producing said 19-bit block by a violation correction stage comprising detecting the occurrence of any of a first plurality of prohibited bit patterns across the boundary between said first and second subcode words in said 19-bit sequence, and detecting the occurrence of any of a second plurality of prohibited bit patterns across the boundary between said second and third subcode words in said 19-bit sequence, and replacing any prohibited bit pattern so detected by a respective substitute bit pattern.

10. A method according to claim 9 wherein said bits of a first value are bits of value "1", and wherein:

said first subcode word is selected from a set of sixty-four subcode words comprising fifty-four 7-bit words that are generated from the Shannon cover for j=2 by making seven transitions starting from state two of the Shannon cover and ending in states one or two thereof and discarding the words represented in hexadecimal format by 00, 01 and 4C, and further comprising ten 7-bit words which are represented in hexadecimal format by 03, 0B, 13, 23, 43, 1B, 2B,4B, 53 and 5B;

said second subcode word is selected from a set of sixty-six subcode words comprising fifty-five 7-bit words that are generated from the Shannon cover for j=2 by making seven transitions starting from state two of the Shannon cover and ending in states one or two thereof and discarding the words represented in hexadecimal format by 00 and 19, and further comprising eleven 7-bit words which are represented in hexadecimal format by 03, 0B, 13, 23, 43, 1B, 2B, 4B, 33, 53 and 5B, wherein for a first predetermined value of said second block the second subcode word is selected as 56 or 33 in dependence on whether said last bit of said first subcode word is 0 or 1 respectively, and for a second predetermined value of said second block the second subcode word is selected as 4C or 06 in dependence on whether said last bit of said first subcode word is 0 or 1 respectively; and said third subcode word is selected from a set of sixteen 5-bit subcode words which are represented in hexadecimal format by 01, 02, 04, 05, 06, 08, 09, 0A, 0C, 0D, 10, 11, 12, 14, 15 and 16.

11. A method according to claim 10 wherein:

said first plurality of prohibited bit patterns comprises bit patterns from the fourth to the tenth bits of said 19-bit sequence, and said first plurality of prohibited bit patterns and the respective substitute bit patterns therefor are as defined in Table 1; and said second plurality of prohibited bit patterns comprises bit patterns from the eleventh to the nineteenth bits of said 19-bit sequence, and said second plurality of prohibited bit patterns and the respective substitute bit patterns therefor are as defined in Table 2;

whereby said first predetermined value for the maximum number of consecutive bits of value "1" in a succession of said G-bit words is $j_1=2$.

12. A method according to claim 11 wherein the step of encoding said G-bit word comprises inserting two parity bits in said G-bit word to produce a (G+2)-bit parity-coded word.

13. A method according to claim 12 wherein one of said parity bits is inserted between the thirty-eighth most recent bit and the thirty-ninth most recent bit of said G-bit word, and the other parity bit is inserted between the ninety-fifth most recent bit and the ninety-sixth most recent bit of said G-bit word.

14. A method according to claim 13 wherein the step of encoding said G-bit word includes encoding the most recent 116 bits of said parity-coded word in accordance with a rate 116/116 block code to generate a further-coded word such that $j_2=2$.

15. A method according to claim 14 wherein the step of encoding said G-bit word includes $1/(1 \oplus D)$ coding said further-coded word to produce said N-bit word, whereby N=(76n+40).

16. A method according to claim 8 wherein M=(64n+32) where n>0, wherein m=16 and g=17, and wherein the step of encoding each 16-bit block to produce a 17-bit block comprises:

partitioning the 16-bit block into first, second and third blocks of four, eight and four bits respectively;

encoding said second block in accordance with a rate 8/9 block code to produce a subcode word, whereby said first block, said subcode word and said third block collectively constitute a 17-bit sequence; and producing said 17-bit block by first, second and third stages of violation correction where:

said first stage comprises detecting the occurrence of any of a first plurality of prohibited 17-bit patterns in said 17-bit sequence and replacing any prohibited bit pattern so detected by a respective substitute bit pattern, and then partitioning the 17-bit sequence into fourth, fifth and sixth blocks of eight, one and eight bits respectively;

said second stage comprises detecting the occurrence of any of a second plurality of prohibited 8-bit patterns in said fourth block, and any of a third plurality of prohibited 8-bit patterns in said sixth block, and replacing any prohibited bit pattern so detected by a respective substitute bit pattern; and said third stage comprises detecting the occurrence of any of a fourth plurality of prohibited 17-bit patterns in the 17-bit sequence resulting from said second stage and replacing any prohibited bit pattern so detected by a respective substitute bit pattern.

17. A method according to claim 16 wherein said bits of a first value are bits of value "1", and wherein said subcode word is selected from a set of 256 subcode words comprising 249 9-bit words that are generated from the Shannon cover for j=3 by making nine transitions starting from state three of the Shannon cover and ending in states one or two thereof, and further comprising seven 9-bit words which are represented in hexadecimal format by 03C, 0BC, 13C, 0BD, 1BD, 13D and 1EF.

18. A method according to claim 17 wherein:
said first plurality of prohibited bit patterns and the respective substitute bit patterns therefor are as defined in Table 3;
said second and third pluralities of prohibited bit patterns and the respective substitute bit patterns therefor are as defined in Tables 4 and 5 respectively; and
said fourth plurality of prohibited bit patterns and the respective substitute bit patterns therefor are as defined in Table 6;
whereby said first predetermined value for the maximum number of consecutive bits of value "1" in a succession of said G-bit words is $j_1=4$, and, in a succession of said G-bit words, a run of four consecutive bits of value "1" can occur only at locations starting with the eighth or sixteenth bits of a said 17-bit block of a said G-bit word, and at all other locations the maximum number of consecutive bits of value "1" is three.

19. A method according to claim 18 wherein the step of encoding said G-bit word comprises inserting two parity bits in said G-bit word to produce a (G+2)-bit parity-coded word.

20. A method according to claim 19 wherein one of said parity bits is inserted between the fourteenth most recent bit and the fifteenth most recent bit of said G-bit word, and the other parity bit is inserted between the twentieth most recent bit and the twenty-first most recent bit of said G-bit word.

21. A method according to claim 20 wherein the step of encoding said G-bit word includes encoding the most recent 36 bits of said parity-coded word in accordance with a rate 36/36 block code to eliminate at least some occurrences of the maximum number of consecutive bit-value transitions in the set of possible N-bit words and generate a further-coded word such that $j_2=4$.

22. A method according to claim 21 wherein the step of encoding said G-bit word includes $1/(1\oplus D)$ coding said further-coded word to produce said N-bit word, whereby $N=(68n+36)$.

23. A method for processing data reproduced from a magnetic recording medium, the reproduced data corresponding to a succession of N-bit code words, produced from a succession of M-bit data words by an encoding method according to claim 1, recorded on said recording medium, the processing method comprising the steps of:
processing the reproduced data in dependence on said predetermined parity condition to detect the N-bit code words corresponding thereto;
decoding each N-bit code word in accordance with a decoding scheme which is the inverse of said second encoding scheme to produce the corresponding said G-bit word; and
decoding each G-bit word in accordance with an MTR decoding scheme which is the inverse of said MTR encoding scheme to recover the corresponding said M-bit data word.

24. Apparatus for encoding a succession of M-bit data words to produce a succession of N-bit code words, where N>M, for supply to a magnetic recording channel, the apparatus comprising:
a first encoder for encoding each M-bit data word in accordance with an MTR coding scheme to produce a G-bit word, where N>G>M, such that the maximum number of consecutive bits of a first value in a succession of said G-bit words is limited to a first predetermined value $j_1$; and
a second encoder for encoding said G-bit word to produce a said N-bit word in accordance with a second coding scheme whereby the second encoder generates at least one parity bit, dependent on the bit-values of said G-bit word, such that the N-bit word satisfies a predetermined parity condition, and maps bits of said first value in the G-bit word to respective bits of the N-bit word which are each of different value to the immediately preceding bit in the N-bit word;
wherein the second coding scheme is such that, in a succession of said N-bit words, the maximum number of consecutive bits which are each of different value to the immediately preceding bit is limited to a second predetermined value $j_2$.

25. Apparatus according to claim 24 wherein the second encoder is configured to generate a plurality of parity bits.

26. Apparatus according to claim 24 wherein said bits of a first value are bits of value "1".

27. Apparatus according to claim 24 wherein the second encoder includes a $1/(1\oplus D)$ precoder for mapping bits of said first value in the G-bit word to said respective bits of the N-bit word.

28. Apparatus according to claim 24 wherein the second encoder comprises a parity encoder for generating said at least one parity bit to produce a parity-coded word, and a further encoder for encoding said parity-coded word in accordance with a further coding scheme to eliminate at least some occurrences of the maximum number of consecutive bit-value transitions in the set of possible N-bit words, said further coding scheme being such that $j_2=j_1$.

29. Apparatus according to claim 24 wherein the second encoder comprises:
a parity encoder for generating said at least one parity bit and inserting said at least one parity bit in said G-bit word to generate a parity-coded word;
a further encoder for encoding said parity-coded word in accordance with a further coding scheme to eliminate at least some occurrences of the maximum number of consecutive bit-value transitions in the set of possible N-bit words and generate a further-coded word such that $j_2=j_1$; and
a $1/(1\oplus D)$ precoder for $1/(1\oplus D)$ coding said further-coded word to produce said N-bit word.

30. Apparatus according to claim 29 wherein said further encoder comprises a rate X/X block encoder, where $X \leq N$.

31. Apparatus according to claim 24 wherein said first encoder comprises a plurality of MTR encoders for receiving respective m-bit blocks of the M-bit data word, each MTR encoder being configured to encode a said m-bit block in accordance with a rate n/g MTR code to produce a g-bit block, whereby the resulting plurality of g-bit blocks produced from the M-bit data word collectively constitute said G-bit word.

32. Apparatus according to claim 31 wherein $M=(64n+32)$ where $n \geq 1$, wherein $m=16$ and $g=19$, and wherein each said MTR encoder comprises:
means for partitioning the 16-bit block into first, second and third blocks of six, six and four bits respectively;
a rate 6/7 block encoder for encoding the first block to produce a first subcode word, a rate 6/7 two-state encoder for encoding the second block to produce a second subcode word, wherein the last bit of said first subcode word is supplied to an input of said two-state encoder to determine the state thereof, and a rate 4/5 block encoder for encoding the third block to produce a third subcode word, whereby said first, second and third subcode words collectively constitute a 19-bit sequence; and violation correction means for producing said 19-bit block by detecting the occurrence of any of a first plurality of prohibited bit patterns across the boundary between said first and second subcode words in said 19-bit sequence, and detecting the occurrence of any of a second plurality of prohibited bit patterns across the boundary between second and third subcode words in said 19-bit sequence, and replacing any prohibited bit pattern so detected by a respective substitute bit pattern.

33. Apparatus according to claim 32 wherein said bits of a first value are bits of value "1", and wherein:

the rate 6/7 block encoder is configured to select said first subcode word from a set of sixty-four subcode words comprising fifty-four 7-bit words that are generated from the Shannon cover for j=2 by making seven transitions starting from state two of the Shannon cover and ending in states one or two thereof and discarding the words represented in hexadecimal format by 00, 01 and 4C, and further comprising ten 7-bit words which are represented in hexadecimal format by 03, 0B, 13, 23, 43, 1B, 2B, 4B, 53 and 5B;

the rate 6/7 two-state encoder is configured to select said second subcode word from a set of sixty-six subcode words comprising fifty-five 7-bit words that are generated from the Shannon cover for j=2 by making seven transitions starting from state two of the Shannon cover and ending in states one or two thereof and discarding the words represented in hexadecimal format by 00 and 19, and further comprising eleven 7-bit words which are represented in hexadecimal format by 03, 0B, 13, 23, 43, 1B, 2B, 4B, 33, 53 and 5B, wherein for a first predetermined value of said second block the two-state encoder is configured to select the second subcode word as 56 or 33 in dependence on whether said last bit of said first subcode word is 0 or 1 respectively, and for a second predetermined value of said second block the two-state encoder is configured to select the second subcode word as 4C or 06 in dependence on whether said last bit of said first subcode word is 0 or 1 respectively; and the rate 4/5 block encoder is configured to select said third subcode word from a set of sixteen 5-bit subcode words which are represented in hexadecimal format by 01, 02, 04, 05, 06, 08, 09, 0A, 0C, 0D, 10, 11, 12, 14, 15 and 16.

34. Apparatus according to claim 33 wherein the violation correction means is configured such that:

said first plurality of prohibited bit patterns comprises bit patterns from the fourth to the tenth bits of said 19-bit sequence, and said first plurality of prohibited bit patterns and the respective substitute bit patterns therefor are as defined in Table 1; and said second plurality of prohibited bit patterns comprises bit patterns from the eleventh to the nineteenth bits of said 19-bit sequence, and said second plurality of prohibited bit patterns and the respective substitute bit patterns therefor are as defined in Table 2;

whereby said first predetermined value for the maximum number of consecutive bits of value "1" in a succession of said G-bit words is $j_1=2$.

35. Apparatus according to claim 34 wherein the parity encoder is configured to insert two parity bits in said G-bit word to produce a (G+2)-bit parity-coded word.

36. Apparatus according to claim 35 wherein the parity encoder is configured to insert one of said parity bits between the thirty-eighth most recent bit and the thirty-ninth most recent bit of said G-bit word, and to insert the other parity bit between the ninety-fifth most recent bit and the ninety-sixth most recent bit of said G-bit word.

37. Apparatus according to claim 36 wherein said second encoder includes a rate 116/116 block encoder for further encoding the most recent 116 bits of said parity-coded word to generate a further-coded word such that $j_2=2$.

38. Apparatus according to claim 37 wherein said second encoder includes a $1/(1 \oplus D)$ precoder for $1/(1 \oplus D)$ coding said further-coded word to produce said N-bit word, whereby N=(76n+40).

39. Apparatus according to claim 31 wherein M=(64n+32) where n≧0, wherein m=16 and g=17, and wherein each said MTR encoder comprises:

means for partitioning the 16-bit block into first, second and third blocks of four, eight and four bits respectively;

a rate 8/9 block encode for encoding said second block to produce a subcode word, whereby said first block, said subcode word and said third block collectively constitute a 17-bit sequence; and violation correction means for producing said 17-bit block by three stages of violation correction comprising:

a first stage comprising detecting the occurrence of any of a first plurality of prohibited 17-bit patterns in said 17-bit sequence and replacing any prohibited bit pattern so detected by a respective substitute bit pattern, and then partitioning the 17-bit sequence into fourth, fifth and sixth blocks of eight, one and eight bits respectively;

a second stage comprising detecting the occurrence of any of a second plurality of prohibited 8-bit patterns in said fourth block, and any of a third plurality of prohibited 8-bit patterns in said sixth block, and replacing any prohibited bit pattern so detected by a respective substitute bit pattern; and a third stage comprising detecting the occurrence of any of a fourth plurality of prohibited 17-bit patterns in the 17-bit sequence resulting from said second stage and replacing any prohibited bit pattern so detected by a respective substitute bit pattern.

40. Apparatus according to claim 39 wherein said bits of a first value are bits of value "1", and wherein the rate 8/9 block encoder is configured to select said subcode word from a set of 256 subcode words comprising 249 9-bit words that are generated from the Shannon cover for j=3 by making nine transitions starting from state three of the Shannon cover and ending in states one or two thereof, and further comprising seven 9-bit words which are represented in hexadecimal format by 03C, 0BC, 13C, 0BD, 1BD, 13D and 1EF.

41. Apparatus according to claim 40 wherein said violation correction means is configured such that:

said first plurality of prohibited bit patterns and the respective substitute bit patterns therefor are as defined in Table 3;

said second and third pluralities of prohibited bit patterns and the respective substitute bit patterns therefor are as defined in Tables 4 and 5 respectively; and said fourth plurality of prohibited bit patterns and the respective substitute bit patterns therefor are as defined in Table 6;

whereby said first predetermined value for the maximum number of consecutive bits of value "1" in a succession of said G-bit words is $j_1=4$, and, in a succession of said G-bit words, a run of four consecutive bits of value "1" can occur only at locations starting with the eighth or sixteenth bits of a said 17-bit block of a said G-bit word, and at all other locations the maximum number of consecutive bits of value "1" is three.

42. Apparatus according to claim 41 wherein the parity encoder is configured to insert two parity bits in said G-bit word to produce a (G+2)-bit parity-coded word.

43. Apparatus according to claim 42 wherein the parity encoder is configured to insert one of said parity bits between the fourteenth most recent bit and the fifteenth most recent bit of said G-bit word, and to insert the other parity bit between the twentieth most recent bit and the twenty-first most recent bit of said G-bit word.

44. Apparatus according to claim 43 wherein said second encoder includes a rate 36/36 block encoder for further encoding the most recent 36 bits of said parity-coded word to eliminate at least some occurrences of the maximum number of consecutive bit-value transitions in the set of possible N-bit words and generate a further-coded word such that $j_2=4$.

45. Apparatus according to claim 44 wherein said second encoder includes a $1/(11 \oplus D)$ precoder for $1/(1 \oplus D)$ coding said further-coded word to produce said N-bit word, whereby $N=(68n+36)$.

46. Apparatus for processing data reproduced from a magnetic recording medium, the reproduced data corresponding to a succession of N-bit code words, produced from a succession of M-bit data words by encoding apparatus according to claim 24, recorded on said recording medium, the processing apparatus comprising:
   a detector for processing the reproduced data in dependence on said predetermined parity condition to detect the N-bit code words corresponding thereto;
   a first decoder for decoding each N-bit code word in accordance with a decoding scheme which is the inverse of said second encoding scheme to produce the corresponding said G-bit word; and
   a second decoder for decoding each G-bit word in accordance with an MTR decoding scheme which is the inverse of said MTR encoding scheme to recover the corresponding said M-bit data word.

47. Apparatus according to claim 46 wherein said detector comprises a noise predictive maximum likelihood sequence detector for detecting and outputting the most likely N-bit code words corresponding to the reproduced data, and a post-processor for correcting predetermined error events in N-bit code words output by said sequence detector in dependence on said predetermined parity condition.

48. Apparatus according to claim 47 wherein the post-processor comprises:
   a set of error event filters for correlating errors in said N-bit code words with respective said error events to produce respective correlation outputs; and
   an error detector for detecting a said error event in a said N-bit code word in dependence on said correlation outputs and controlling correction of a said error event so identified in dependence on said predetermined parity condition.

49. A data storage system comprising:
   encoder apparatus for encoding a succession of M-bit data words to produce a succession of N-bit code words, where N>M, for supply to a magnetic recording channel, the encoder apparatus comprising: a first encoder for encoding each M-bit data word in accordance with an MTR coding scheme to produce a G-bit word, where N>G>M, such that the maximum number of consecutive bits of a first value in a succession of said G-bit words is limited to a first predetermined value $j_1$; and a second encoder for encoding said G-bit word to produce a said N-bit word in accordance with a second coding scheme whereby the second encoder generates at least one parity bit, dependent on the bit-values of said G-bit word, such that the N-bit word satisfies a predetermined parity condition, and maps bits of said first value in the G-bit word to respective bits of the N-bit word which are each of different value to the immediately preceding bit in the N-bit word, the second coding scheme being such that, in a succession of said N-bit words, the maximum number of consecutive bits which are each of different value to the immediately preceding bit is limited to a second predetermined value $j_2$;
   a recording channel comprising means for recording a succession of said N-bit code words on a magnetic recording medium, and means for reading the magnetic recording medium to generate reproduced data corresponding to said N-bit code words; and
   processing apparatus comprising: a detector for processing the reproduced data in dependence on said predetermined parity condition to detect the N-bit code words corresponding thereto; a first decoder for decoding each N-bit code word in accordance with a decoding scheme which is the inverse of said second encoding scheme to produce the corresponding said G-bit word; and a second decoder for decoding each G-bit word in accordance with an MTR decoding scheme which is the inverse of said MTR encoding scheme to recover the corresponding said M-bit data word.

* * * * *